United States Patent
Uemura et al.

(10) Patent No.: US 11,114,418 B2
(45) Date of Patent: Sep. 7, 2021

(54) ELECTRONIC DEVICE, METHOD OF MANUFACTURING ELECTRONIC DEVICE, AND ELECTRONIC APPARATUS

(71) Applicant: FUJITSU LIMITED, Kawasaki (JP)

(72) Inventors: Taiki Uemura, Kawasaki (JP); Taiji Sakai, Yokohama (JP); Seiki Sakuyama, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 63 days.

(21) Appl. No.: 16/392,797

(22) Filed: Apr. 24, 2019

(65) Prior Publication Data
US 2019/0252357 A1 Aug. 15, 2019

Related U.S. Application Data

(63) Continuation of application No. PCT/JP2016/082385, filed on Nov. 1, 2016.

(51) Int. Cl.
*H01L 23/34* (2006.01)
*H01L 25/07* (2006.01)
(Continued)

(52) U.S. Cl.
CPC .......... *H01L 25/071* (2013.01); *H01L 23/473* (2013.01); *H01L 23/5385* (2013.01); *H01L 24/08* (2013.01); *H01L 24/16* (2013.01); *H01L 24/17* (2013.01); *H01L 24/32* (2013.01); *H01L 24/48* (2013.01); *H01L 24/73* (2013.01);
(Continued)

(58) Field of Classification Search
CPC ....... H01L 2224/32145; H01L 25/0657; H01L 2224/97; H01L 2924/14; H01L 25/0655; H01L 2224/16145; H01L 24/0652; H01L 2224/48145

USPC ........ 257/686, 777, 712; 438/107, 108, 109, 438/110
See application file for complete search history.

(56) References Cited

U.S. PATENT DOCUMENTS 5,198,963 A * 3/1993 Gupta ................ G01R 31/2863
257/737
5,284,831 A * 2/1994 Kahl ....................... A61P 35/00
424/1.65
(Continued)

FOREIGN PATENT DOCUMENTS

JP 2000-244088 A 9/2000
JP 2002-207986 A 7/2002
(Continued)

OTHER PUBLICATIONS

JPOA—Office Action of Japanese Patent Application No. 2018-548474 dated Apr. 28, 2020 with Machine Translation.
(Continued)

*Primary Examiner* — Luan C Thai
(74) *Attorney, Agent, or Firm* — Fujitsu Patent Center

(57) ABSTRACT

An electronic device includes: a first layer that includes first electronic components in a group and has a first through space between adjacent ones of the first electronic components; and a second layer that is stacked over the first layer and includes second electronic components which are coupled to the first electronic components and a second through space between adjacent ones of the second electronic components, the second through space being partially overlapping with the first through space.

6 Claims, 19 Drawing Sheets

(51) Int. Cl.
   *H01L 25/00* (2006.01)
   *H01L 23/00* (2006.01)
   *H01L 23/473* (2006.01)
   *H01L 23/538* (2006.01)
   *H01L 25/18* (2006.01)
   *H01L 25/065* (2006.01)
   *H01L 23/467* (2006.01)

(52) U.S. Cl.
   CPC ............ *H01L 25/065* (2013.01); *H01L 25/07* (2013.01); *H01L 25/18* (2013.01); *H01L 25/50* (2013.01); *H01L 23/467* (2013.01); *H01L 24/29* (2013.01); *H01L 2224/08225* (2013.01); *H01L 2224/16145* (2013.01); *H01L 2224/16146* (2013.01); *H01L 2224/16225* (2013.01); *H01L 2224/17181* (2013.01); *H01L 2224/2919* (2013.01); *H01L 2224/29298* (2013.01); *H01L 2224/32225* (2013.01); *H01L 2224/48091* (2013.01); *H01L 2224/48225* (2013.01); *H01L 2224/73204* (2013.01); *H01L 2224/73265* (2013.01); *H01L 2924/00014* (2013.01); *H01L 2924/181* (2013.01)

(56) References Cited

U.S. PATENT DOCUMENTS

| | | | | |
|---|---|---|---|---|
| 5,583,748 A * | 12/1996 | Gochi | ................... | H01L 25/105 361/784 |
| 5,856,915 A * | 1/1999 | Weinberg | ............... | H05K 7/023 361/790 |
| 6,100,593 A * | 8/2000 | Yu | .......................... | H01L 23/055 |
| 6,222,265 B1 * | 4/2001 | Akram | ................... | H05K 1/144 257/678 |
| 6,717,812 B1 * | 4/2004 | Pinjala | .................. | H01L 23/473 165/80.4 |
| 7,525,199 B1 * | 4/2009 | Lauterbach | ............. | H01L 23/48 257/723 |
| 2003/0022417 A1 | 1/2003 | Steele et al. | | |
| 2003/0183930 A1 | 10/2003 | Fukasawa | | |
| 2004/0104469 A1 | 6/2004 | Yagi et al. | | |
| 2004/0251530 A1 | 12/2004 | Yamaji | | |
| 2010/0013072 A1 | 1/2010 | Hasegawa | | |
| 2013/0099373 A1 | 4/2013 | Kwon et al. | | |
| 2014/0027885 A1 | 1/2014 | Kawase et al. | | |

FOREIGN PATENT DOCUMENTS

| | | |
|---|---|---|
| JP | 2003-017649 A | 1/2003 |
| JP | 2005-005529 A | 1/2005 |
| JP | 2012-216836 A | 11/2012 |
| WO | 2008/139605 A1 | 11/2008 |

OTHER PUBLICATIONS

International Search Report and Written Opinion of the International Searching Authority (Form PCT/ISA/210, 220, and 237), mailed in connection with PCT/JP2016/082385 and dated Jan. 10, 2017 (12 pages).

* cited by examiner

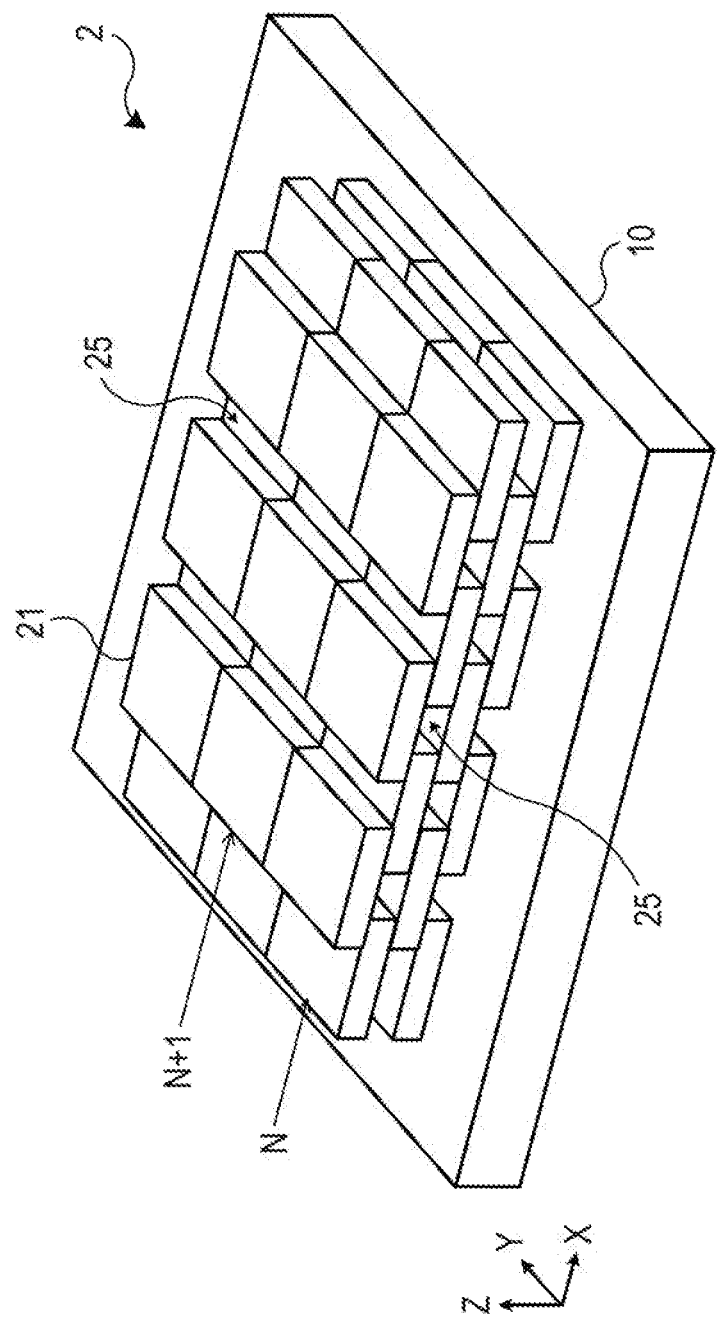

ELECTRONIC DEVICE, METHOD OF MANUFACTURING ELECTRONIC DEVICE, AND ELECTRONIC APPARATUS

CROSS-REFERENCE TO RELATED APPLICATION

This application is a continuation application of International Application PCT/JP2016/082385 filed on Nov. 1, 2016 and designated the U.S., the entire contents of which are incorporated herein by reference.

FIELD

The embodiments discussed herein are related to an electronic device, a method of manufacturing an electronic device, and an electronic apparatus.

BACKGROUND

A technique of stacking groups of electronic components, so-called three-dimensional stacking technique (also called three-dimensional mounting technique, three-dimensional integration technique, etc.) is known. For example, a technique of stacking groups of semiconductor elements, and a technique of stacking groups of circuit boards or groups of circuit boards on which semiconductor elements are mounted are known.

Japanese Laid-open Patent Publication No. 2012-216836 and Japanese Laid-open Patent Publication No. 2000-244088 are disclosed as related art.

SUMMARY

According to an aspect of the embodiments, an electronic device includes: a first layer that includes first electronic components in a group and has a first through space between adjacent ones of the first electronic components; and a second layer that is stacked over the first layer and includes second electronic components which are coupled to the first electronic components and a second through space between adjacent ones of the second electronic components, the second through space being partially overlapping with the first through space.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is a view illustrating a comparative example of an electronic device;

DESCRIPTION OF EMBODIMENTS

In a stacked body including groups of electronic components, a small gap or no gap between the electronic components may lower the heat dissipation and then lower the cooling efficiency, causing overheating. Overheating of a stacked body may cause performance degradation or damage of electronic components or a group of electronic components included in the stacked body, as well as an electronic devices or an electronic apparatus including the stacked body.

First, an example of a stacked body including groups of electronic components will be described.

Figure 1A:
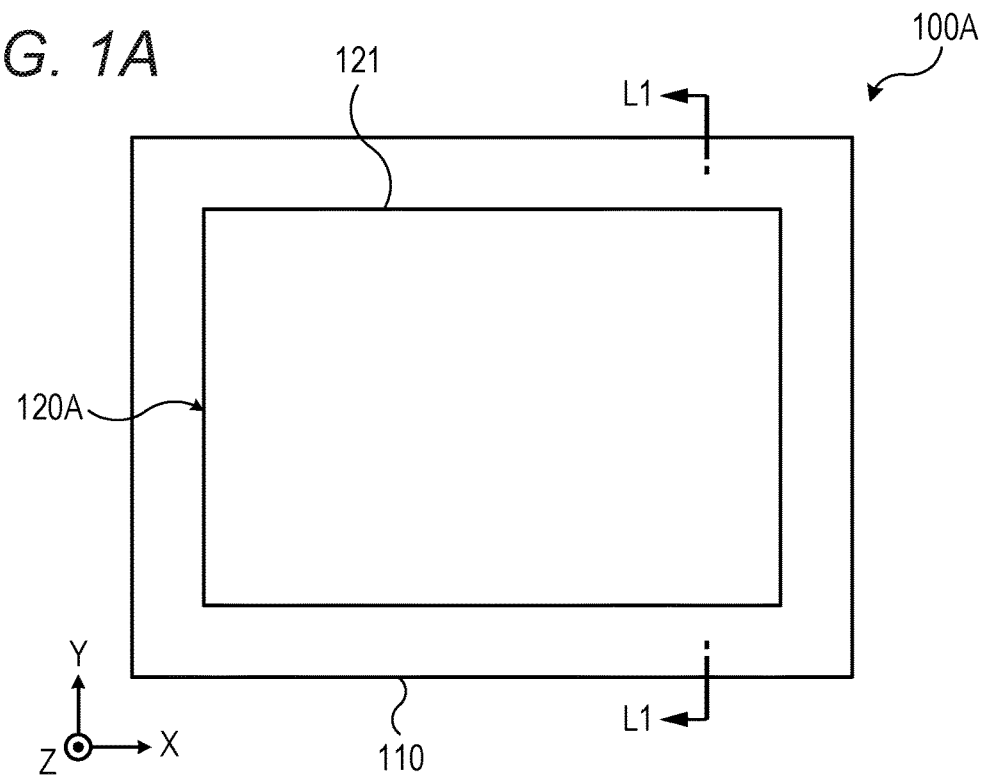
FIGS. 1A and 1B are views illustrating an example of an electronic device.
Figure 1B:
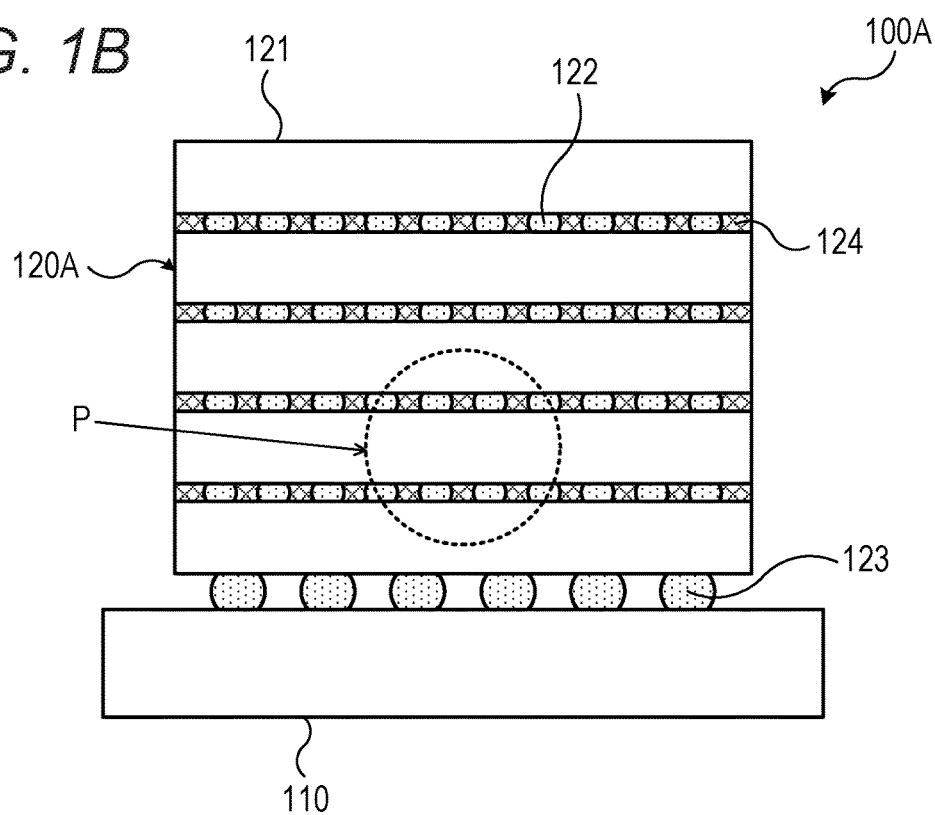

FIGS. 1A and 1B are views illustrating an example of an electronic device. FIG. 1A is a schematic plan view of a main part of the example of an electronic device. FIG. 1B is a schematic sectional view taken along line L1-L1 of FIG. 1A.

The electronic device 100A illustrated in FIGS. 1A and 1B includes a circuit board 110 and a stacked body 120A mounted on the circuit board 110.

For example, an interposer or a motherboard is used as the circuit board 110. The stacked body 120A includes a plurality of semiconductor elements 121 (electronic components) stacked via bumps 122 made of, for example, solder. Adjacent upper and lower stacked semiconductor elements 121 are coupled using the interposed bumps 122. Between the adjacent upper and lower semiconductor elements 121, a gap is formed by connection using the bumps 122. The gap may be filled with an adhesive 124 made of, for example, an underfill resin as illustrated in FIG. 1B. The semiconductor element 121 at the lowermost layer of the stacked body 120A like this is coupled to the circuit board 110 using bumps 123 made of, for example, solder.

The stacked body 120A may include a semiconductor element 121 or groups of semiconductor elements 121 that generate heat during operation. In the stacked body 120A that generates heat as described above, if the gap between adjacent upper and lower semiconductor elements (121) is narrowed due to miniaturization of the bumps 122 and 123 resulting from the increase in the number of pins, or if the gap is filled with the adhesive 124, the heat dissipation is lowered and the cooling efficiency is lowered. That is, in the stacked body 120A as described above, the cooling fluid of gas or liquid supplied to the outside of the stacked body 120A is difficult to flow or does not flow through the gap between the semiconductor elements 121. Therefore, heat does not escape easily from the inside of the stacked body 120A illustrated by the dotted line frame P in FIG. 1 as compared with the outer peripheral portion of the stacked body 120A to which cooling fluid is supplied relatively close.

The low heat dissipation and the low cooling efficiency of the stacked body 120A may cause overheating of the stacked body 120A, and the overheating may then cause performance degradation or damage of the stacked body 120A or the electronic device 100A including the stacked body 120A.

Figure 2A:
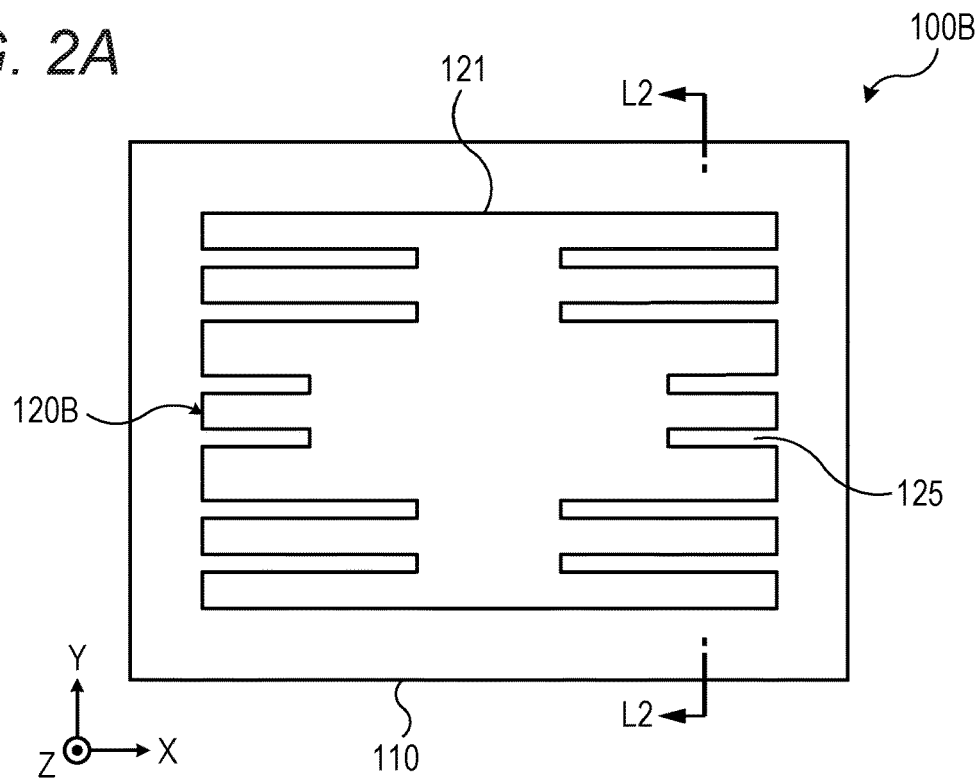
FIGS. 2A and 2B are views illustrating another example of an electronic device.
Figure 2B:
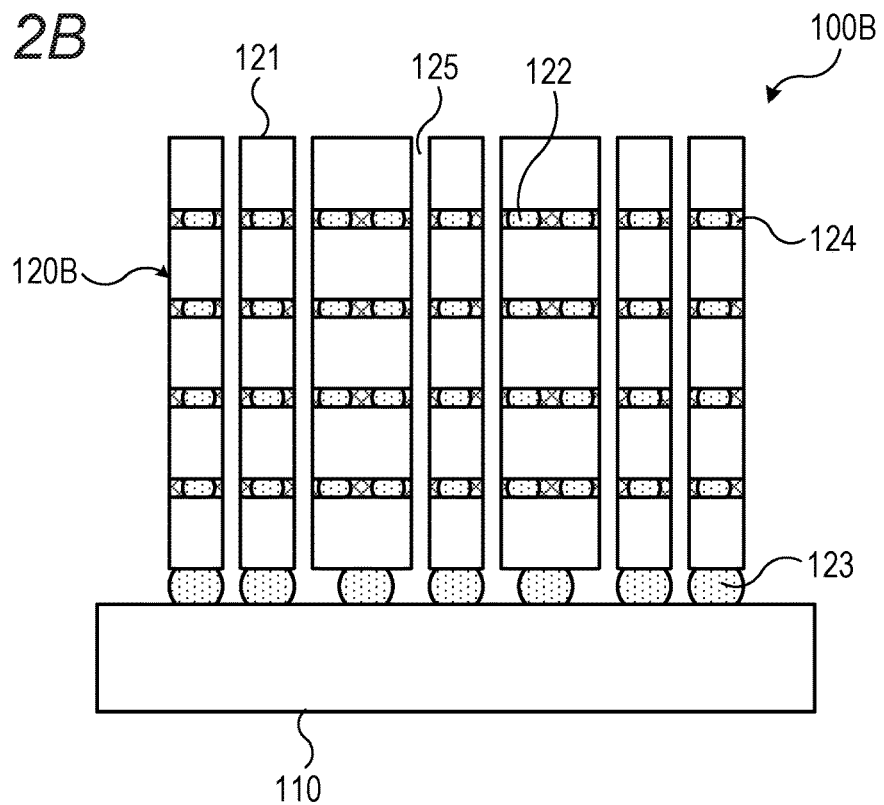

The electronic device 100A described above is assumed to have, for example, a structure illustrated in FIGS. 2A and 2B.

FIGS. 2A and 2B are views illustrating another example of an electronic device. FIG. 2A is a schematic plan view of a main part of the example of an electronic device. FIG. 2B is a schematic sectional view taken along line L2-L2 of FIG. 2A.

The electronic device 100B illustrated in FIGS. 2A and 2B includes a circuit board 110 and a stacked body 120B mounted on the circuit board 110. A plurality of grooves 125 extending from the side surface to the inside of the stacked body 120B is formed in the stacked body 120B. The formation of the grooves 125 like this increases the surface area of the stacked body 120B and increases the contact area with the cooling fluid supplied to the outside thereof.

Figure 3A:
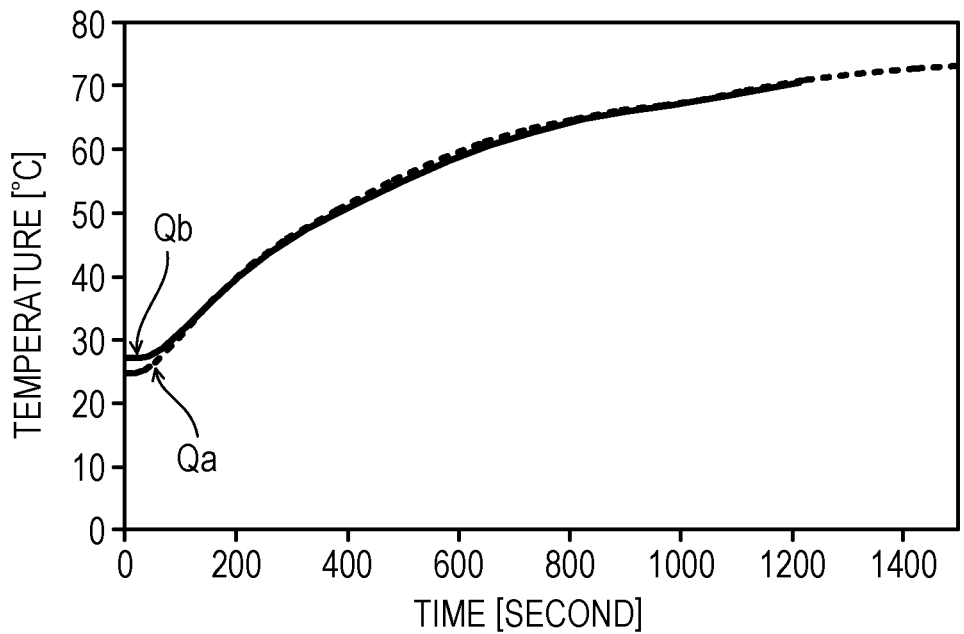
FIGS. 3A and 3B are graphs illustrating an example of temperature transition (No. 1)
Figure 3B:
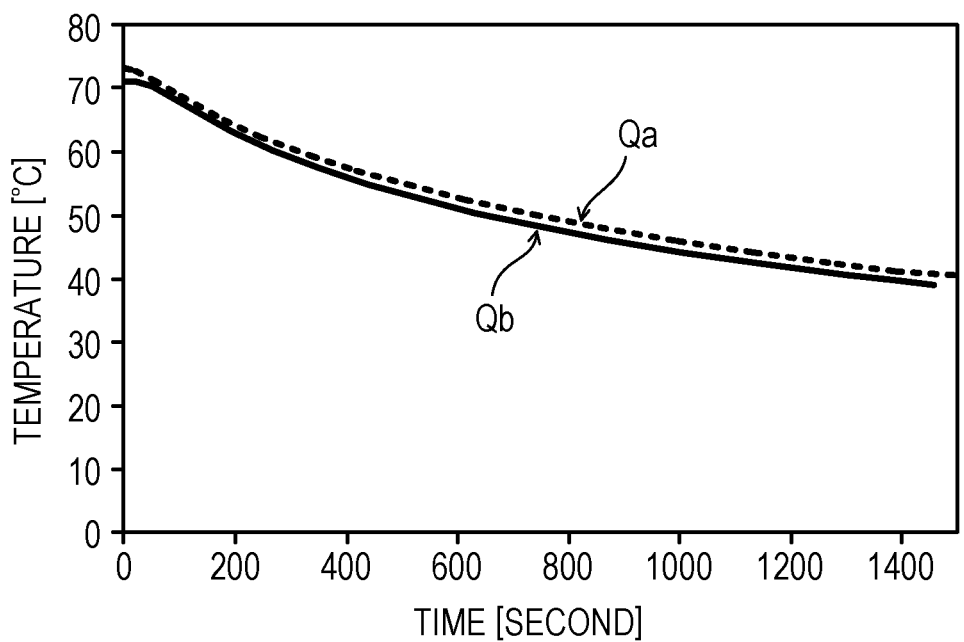

An example of the temperature transition is illustrated in FIGS. 3A and 3B.

FIG. 3A illustrates n example of the simulation results of the temperature transition in the temperature rising process of the electronic device 100A illustrated in FIGS. 1A and 1B and the electronic device 100B illustrated in FIGS. 2A and 2B. FIG. 3B illustrates an example of the simulation results of the temperature transition in the cooling process of the electronic device 100A and the electronic device 100B. In FIGS. 3A and 3B, the temperature transition of the electronic device 100A is illustrated by a dotted line Qa, and the temperature transition of the electronic device 100B is illustrated by a solid line Qb.

As illustrated in FIG. 3A, there is almost no difference in the temperature transition in the temperature rising process between the electronic device 100A (dotted line Qa) and the electronic device 100B (solid line Qb), and it is understood that the electronic devices have almost the same heat capacity. As illustrated in FIG. 3B, there is no large difference in the temperature transition in the cooling process between the electronic device 100A (dotted line Qa) and the electronic device 100B (solid line Qb). From this, it can be seen that even if the grooves 125 are formed as in the electronic device 100B, a remarkable improvement in heat dissipation and cooling efficiency is not obtained as compared with the electronic device 100A.

In view of the above, a configuration as described in a following embodiment is employed here to improve the heat dissipation of a stacked body of groups of electronic components and improve the cooling efficiency, thereby suppressing performance degradation and damage due to overheating of the stacked body and an electronic device including the stacked body.

First, a first embodiment will be described.

Figure 4:
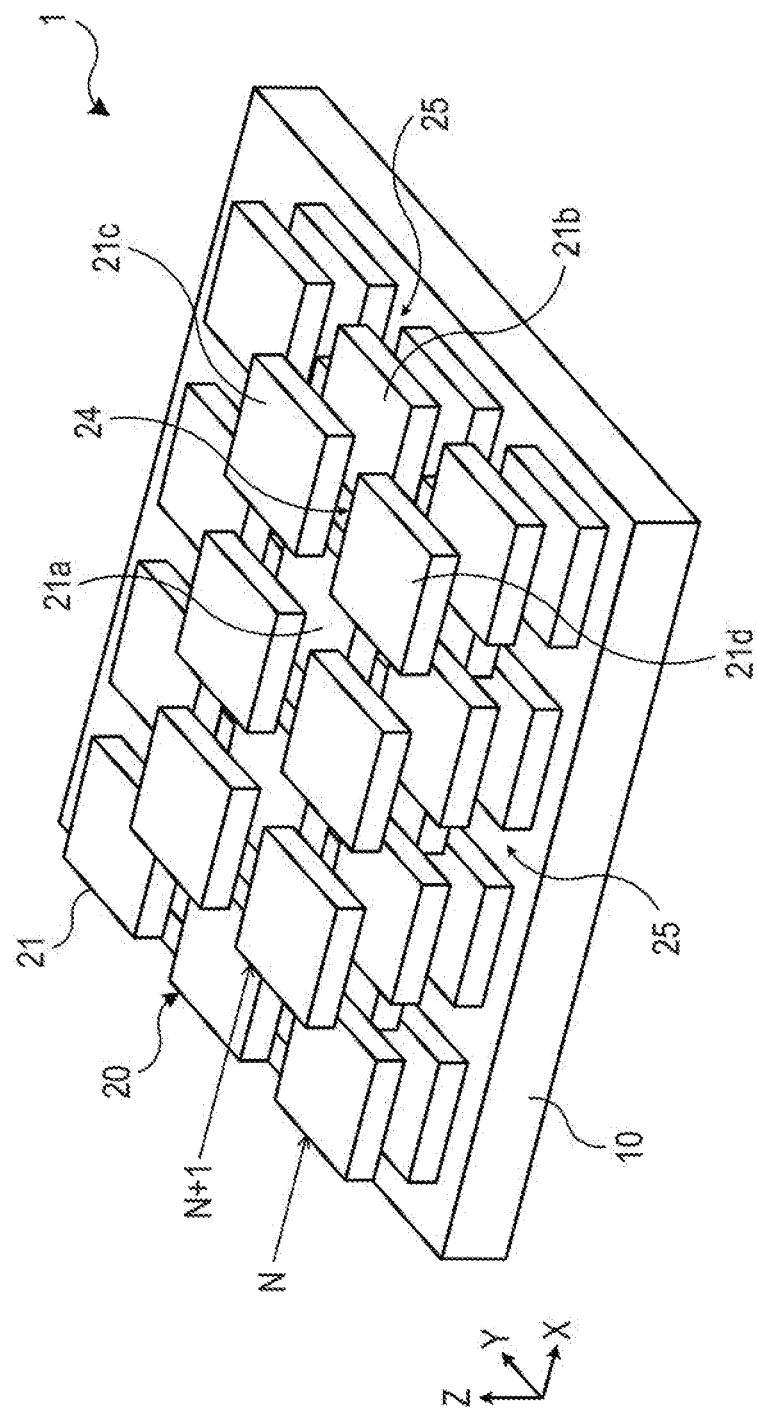
FIG. 4 is a view illustrating an example of an electronic device according to a first embodiment (No. 1)
Figure 5A:
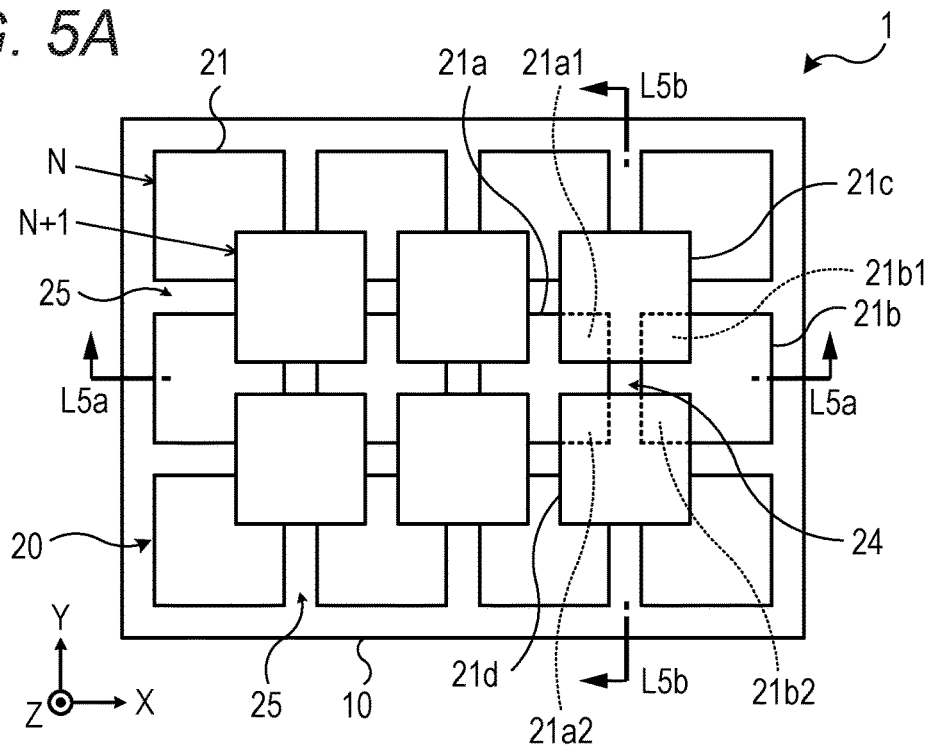
FIGS. 5A to 5C are views illustrating the example of the electronic device according to the first embodiment (No. 2)
Figure 5B:
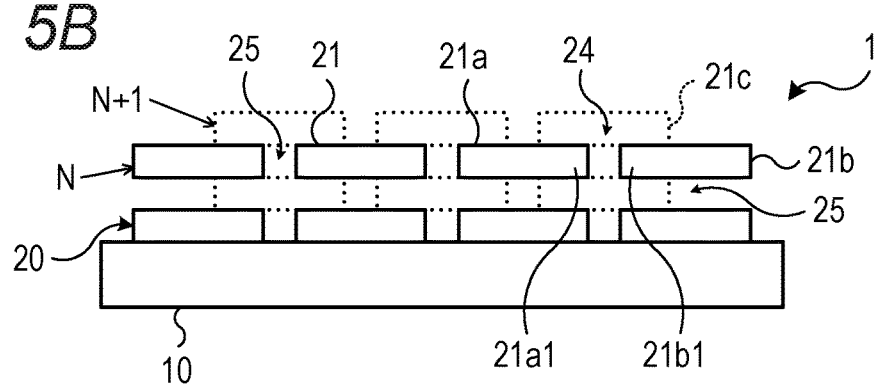
Figure 5C:
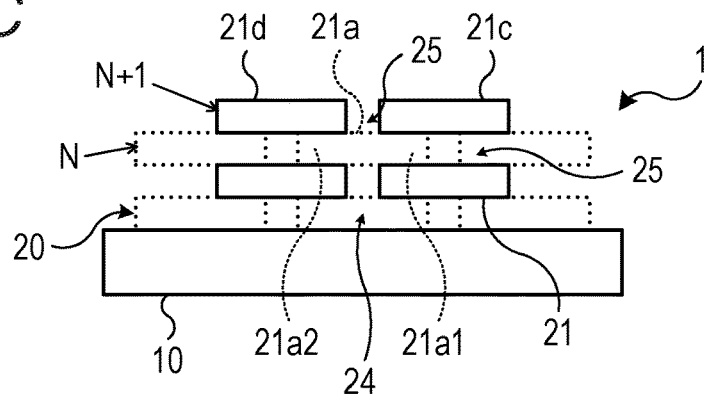

FIGS. 4 and 5A to 5C are views illustrating an example of an electronic device according to the first embodiment. FIG. 4 is a schematic perspective view of a main part of an example of an electronic device. FIG. 5A is a schematic plan view of the main part of the example of the electronic device. FIG. 5B is a schematic sectional view taken along line L5a-L5a of FIG. 5A. FIG. 5C is a schematic sectional view taken along line L5b-L5b of FIG. 5A. In FIGS. 5B and 5C, electronic components that do not exist on the cross section are illustrated by dotted lines for convenience.

The electronic device 1 illustrated in FIGS. 4 and 5A to 5C includes a circuit board 10 and a stacked body 20 (here, a 4-layer stacked body 20 as an example) mounted on the circuit board 10.

For example, an interposer or a motherboard is used as the circuit board 10. The stacked body 20 includes groups of electronic components 21 stacked in the Z direction. For example, a semiconductor element or a semiconductor device including a semiconductor element is used in the groups of electronic components 21 of the stacked body 20. An example of the structure of the semiconductor element and the semiconductor device will be described below (FIGS. 12 to 15). The electronic components 21 in the groups are stacked via bumps (not illustrated) made of, for example, solder. The electronic components 21 between adjacent upper and lower layers are coupled by interposed bumps. The electronic components 21 of the lowermost layer are coupled to the circuit board 10 using bumps (not illustrated) made of, for example, solder.

The stacked body 20 of the electronic device includes an N-th layer (N is a natural number) including electronic components 21 in a group arranged to be separated from each other, and an (N+1)-th layer including electronic components 21 in a group arranged to be separated from each other. The electronic components 21 in the (N+1)-th layer are stacked over predetermined portions of the electronic components 21 included in the N-th layer. In FIGS. 4 and 5A to 5C, for convenience, the uppermost layer of the stacked body 20 is illustrated as the (N+1)-th layer, and the layer lower than the uppermost layer by one layer is illustrated as the N-th layer.

In the stacked body 20, the electronic components 21 in the group of each of the N-th layer and the (N+1)-th layer are arranged such that the gaps 25 (through spaces) between adjacent electronic components 21 separated from each other in the N-th layer and the gaps 25 (through spaces) between adjacent electronic components 21 separated from each other in the (N+1)-th layer partially overlap with each other.

For example, out of the groups of electronic components 21 of the stacked body 20, some of the electronic components 21 in the groups are focused. As illustrated in FIGS. 5A to 5C, the stacked body 20 has a first structural portion in which an electronic component 21c in the (N+1)-th layer is stacked over opposing one end portions 21a1 and 21b1 of adjacent electronic components 21a and 21b that are arranged side by side and separated from each other in the N-th layer. The stacked body 20 further includes a second structural portion in which an electronic component 21d in the (N+1)-th layer is stacked over the other end portions 21a2 and 21b2, which oppose to each other, of the adjacent electronic components 21a and 21b in the N-th layer, and the electronic component 21d is separated from the electronic component 21c.

The N-th layer and the (N+1)-th layer of the stacked body 20 include structural portions repeatedly arranged similarly to the arrangement of the first and second structural portions.

In the stacked body 20, a part of the gap 25 between adjacent electronic components 21 that are separated from each other (for example, between electronic components 21a and 21b) in the N-th layer and a part of the gap 25 between adjacent electronic components 21 that are separated from each other (for example, between the electronic components 21c and 21d) in the (N+1)-th layer stacked over the electronic components 21 in the N-th layer overlap with each other. Thus, in the stacked body 20, a space communicating through two layers of the N-th layer and the (N+1)-th layer is formed. That is, a wellhole 24 is formed.

By similarly employing the arrangement of the structural portions in the N-th layer and the (N+1)-th layer in adjacent upper and lower layers from the lowermost layer to the uppermost layer of the stacked body 20, the wellhole 24 communicating from the lowermost layer to the uppermost layer of the stacked body 20 as illustrated in FIGS. 4 and 5A to 5C may be formed.

In the stacked body 20 having the above-described structure, the groups of electronic components 21 of each of the layers are arranged side by side with gaps 25 therebetween. The gaps 25 realize a flow path through which cooling fluid can flow in the X direction or the Y direction. Further, in the stacked body 20, the gaps 25 in adjacent upper and lower layers partially overlap to form a wellhole 24 communicating across a plurality of layers. The wellhole 24 realizes a flow path through which cooling fluid can flow in the Z direction.

As a result, the cooling fluid supplied to the outside of the stacked body 20 is allowed to flow through the gaps 25 between the adjacent electronic components 21 in each of the layers, and to flow through the wellholes 24 communicating across the plurality of layers, whereby the stacked body 20 can be cooled efficiently. For example, the cooling fluid supplied to the outside of the stacked body 20 flows into a gap 25 between adjacent electronic components 21 in each layer. The cooling fluid that has flowed into the gap 25 and has been warmed by taking heat generated in the stacked body 20 is discharged to the outside of the stacked body 20 due to the chimney effect of the wellhole 24 that communicates with the gap 25 and communicates with the plurality of layers. Such a flow of cooling fluid allows the stacked body 20 to be cooled efficiently.

An example of the temperature transition is illustrated in FIG. 6.

Figure 6A:
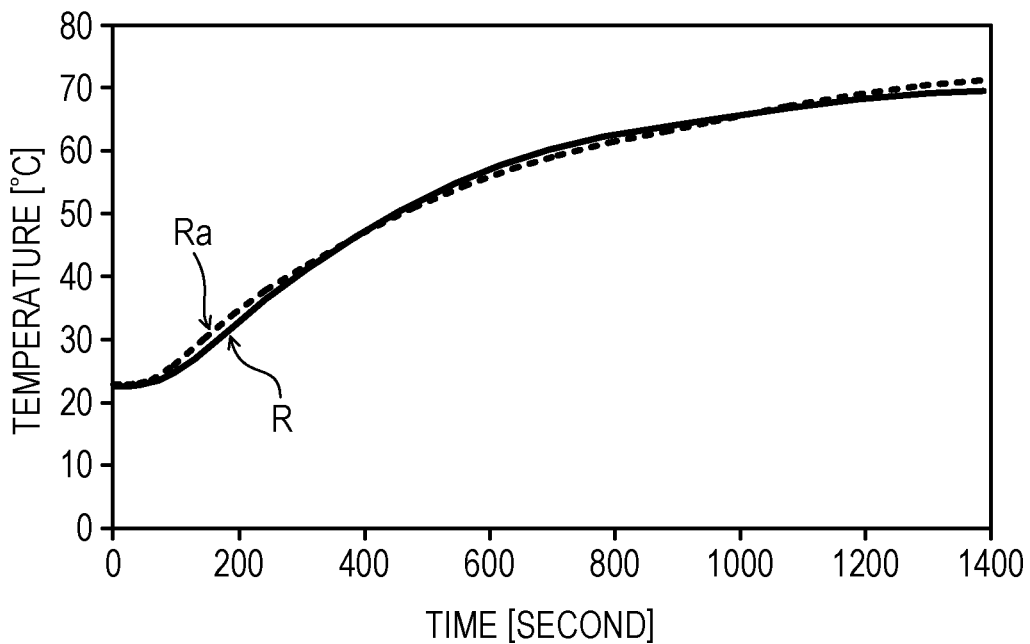
FIGS. 6A and 6B are graphs illustrating an example of temperature transition (No. 2)
Figure 6B:
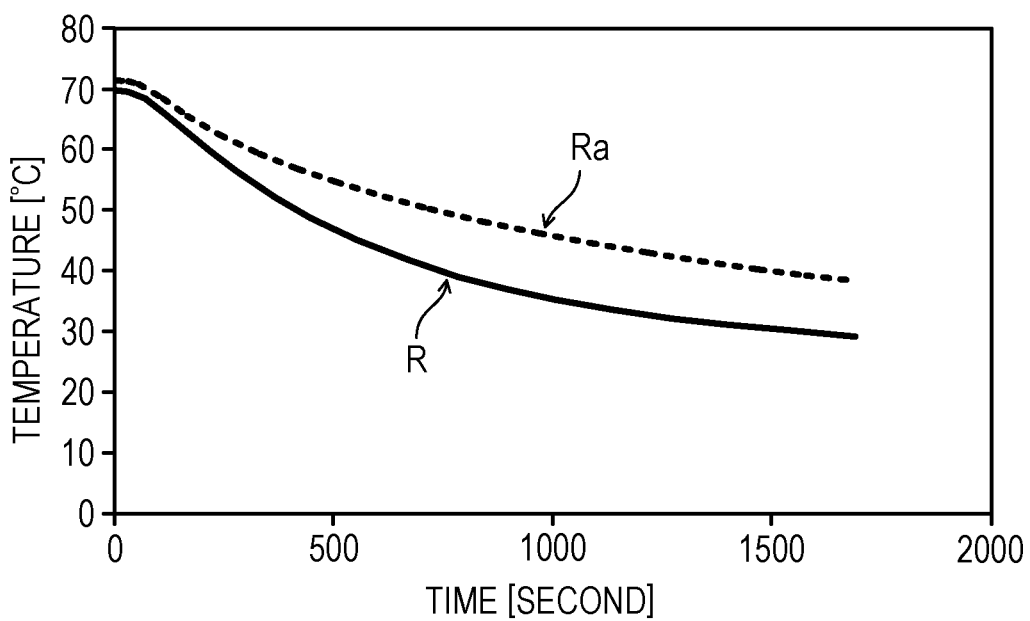

FIG. 6A illustrates an example of the simulation results of the temperature transition in the temperature rising process of the electronic device 100A illustrated in FIGS. 1A and 1B and the electronic device 1 illustrated in FIGS. 4, 5A, and 5B. FIG. 6B illustrates an example of the simulation results of the temperature transition in the cooling process. In FIGS. 6A and 6B, the temperature transition of the electronic device 100A is illustrated by a dotted line Ra, and the temperature transition of the electronic device 1 is illustrated by a solid line R.

As illustrated in FIG. 6A, there is almost no difference in the temperature transition in the temperature rising process between the electronic device 100A (dotted line Ra) and the electronic device 1 (solid line R), and it is understood that the electronic devices have almost the same heat capacity. As illustrated in FIG. 6B, there is a relatively large difference in the temperature transition in the cooling process between the electronic device 100A (dotted line Ra) and the electronic device 1 (solid line R), and it is understood that the cooling speed of the electronic device 1 is higher than that of the electronic device 100A, and the electronic device 1 exhibits excellent heat dissipation and cooling efficiency.

According to the electronic device 1, the gaps 25 are provided between the adjacent electronic components 21 in each of the layers of the stacked body 20, and the wellholes 24 communicating across the plurality of layers of the stacked body 20 are provided, whereby the stacked body 20 may be cooled efficiently.

A comparative example of an electronic device is illustrated in FIG. 7. FIG. 7 is a schematic perspective view of a main part of an example of an electronic device.

An electronic device illustrated in FIG. 7 includes a group of electronic components 21 in each of the N and (N+1)-th layers. In the group, adjacent electronic components 21 are arranged side by side to be separated in the X direction and in contact with each other in the Y direction so that the electronic device 2 has a structure in which a gap 25 between adjacent electronic components 21 in the N-th layer is closed by an electronic component 21 in the (N+1)-th layer. In FIG. 7, for convenience, the uppermost layer of the stacked body 20 is illustrated as the (N+1)-th layer, and the layer lower than the uppermost layer by one layer is illustrated as the N-th layer. The electronic device 2 according to this comparative example does not have any wellhole 24 that is formed in the electronic device 1.

Figure 8:
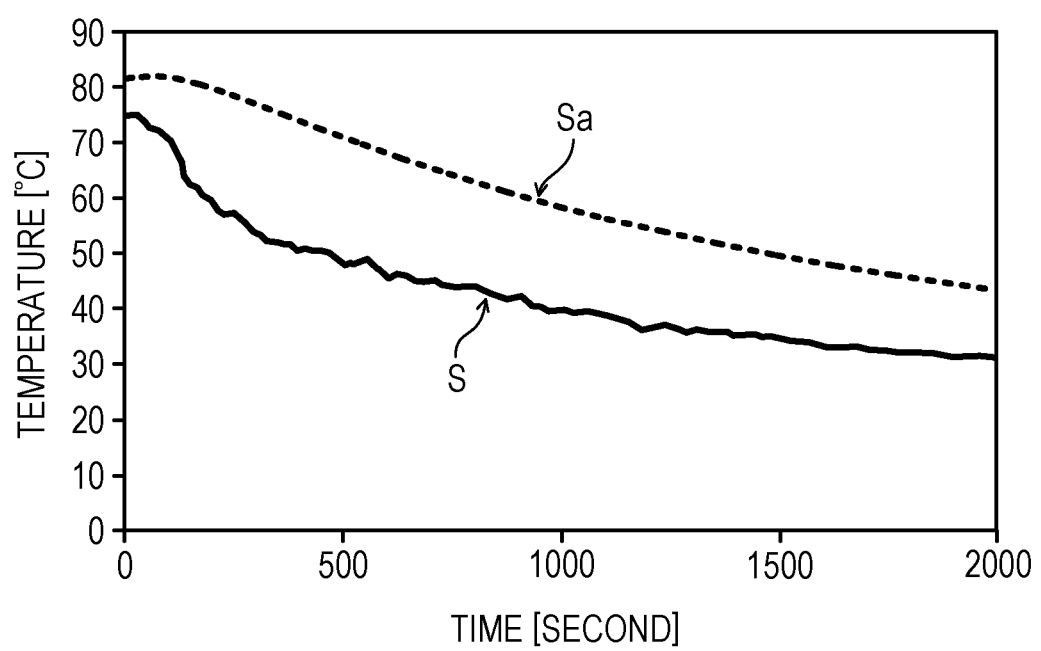
FIG. 8 is a graph illustrating an example of temperature transition (No. 3)

An example of the temperature transition is illustrated in FIG. 8.

FIG. 8 illustrates an example of the simulation results of the temperature transition in the cooling process of the electronic device 2 illustrated in FIG. 7 and the electronic device 1 illustrated in FIGS. 4 and 5A to 5C. In FIG. 8, the temperature transition of the electronic device 2 is illustrated by a dotted line Sa, and the temperature transition of the electronic device 1 is illustrated by a solid line S.

As illustrated in FIG. 8, there is a relatively large difference in the temperature transition in the cooling process between the electronic device 2 (dotted line Sa) and the electronic device 1 (solid line S), and it is understood that the cooling speed of the electronic device 1 is higher than that of the electronic device 2, and the electronic device 1 exhibits excellent heat dissipation and cooling efficiency.

As described above, in the electronic device 1, the gaps 25 are provided between the adjacent electronic components 21 in each layer of the stacked body 20, and the wellholes 24 communicating across the plurality of layers of the stacked body 20 are provided. By the cooling fluid flowing from the outside into the gaps 25, flowing through the gaps 25, and discharged due to the chimney effect of the wellholes 24, the heat dissipation and the cooling efficiency of the stacked body 20 are improved.

In the electronic device 1 described above, it is preferable to efficiently feed cooling fluid of a low temperature through the side surface of the stacked body 20 into the gaps 25 from the viewpoint of improving heat dissipation and cooling efficiency. For example, a suitable cooling device may be used to supply cooling fluid of a low temperature toward the side surface of the stacked body 20.

Figure 9:
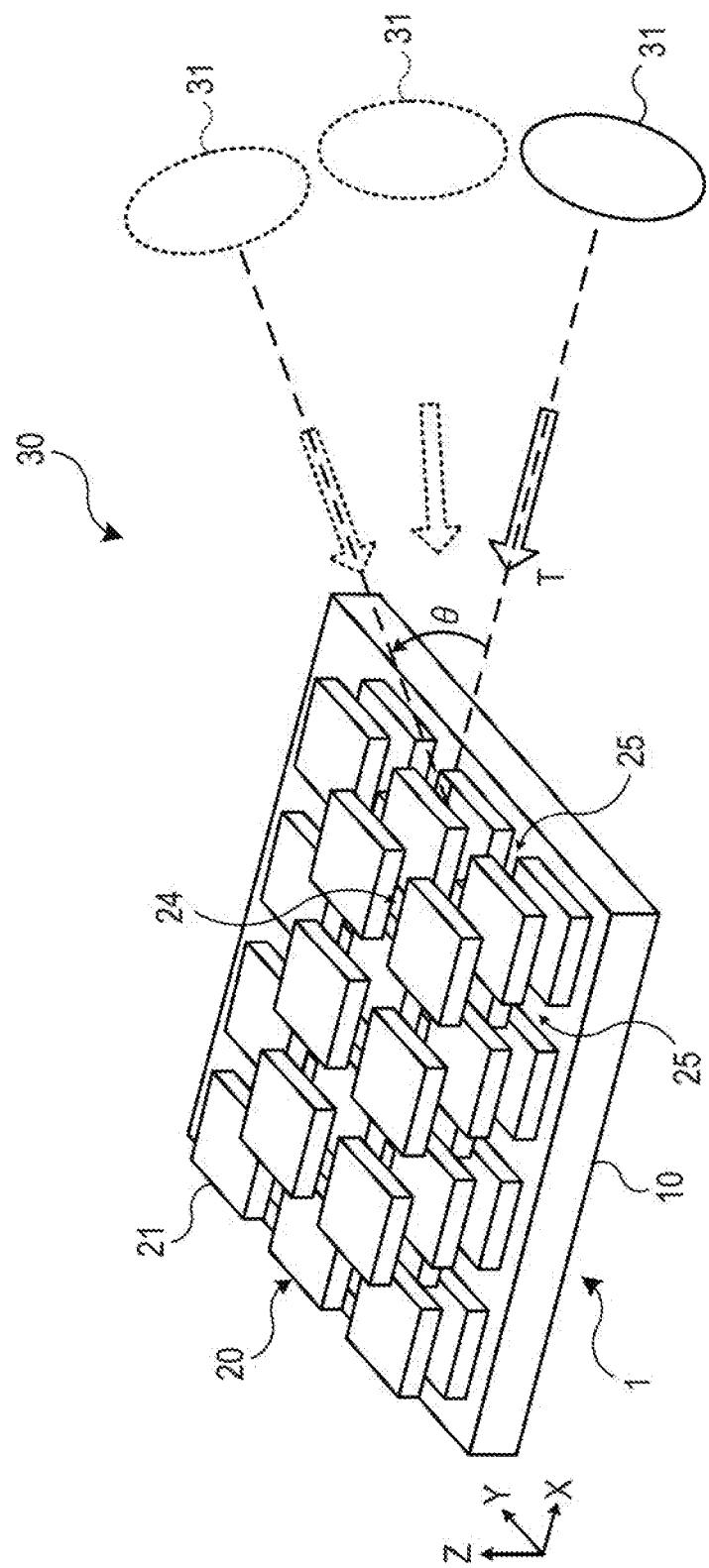
FIG. 9 is an explanatory view of the electronic apparatus according to the first embodiment.

FIG. 9 is an explanatory view of the electronic apparatus according to the first embodiment.

The electronic apparatus 30 illustrated in FIG. 9 includes the electronic device 1 described above and a cooling device 31 for supplying cooling fluid to the stacked body 20 of the electronic device 1. If the cooling fluid is gas, the cooling device includes a fan (or a fan and a pipe) for blowing the cooling fluid, and if the cooling fluid is liquid, the cooling device 31 includes a pump and a pipe for delivering the cooling fluid. The cooling device 31 supplies cooling fluid of gas or liquid to the side surface of the stacked body 20 of the electronic device 1.

A supply direction T of cooling fluid blown by the cooling device 31 is preferably in an angular range of 45° or less (θ≤45°) with respect to the XY plane from the side surface of the stacked body 20. Since the stacked body 20 has a structure in which the gaps 25 extend in the X and Y directions and the wellholes 24 extend in the Z direction, when the cooling fluid supply direction (T) is set in such an angular range, the flow into the gaps 25, the flow through the gap 25, and the discharge from the wellholes 24 due to the chimney effect can proceed efficiently. As a result, the stacked body 20 may be cooled with high efficiency.

If the supply direction T of the cooling fluid is larger than the above angular range (θ>45°), the amount of the cooling fluid flowing into the gaps 25 may be reduced, thereby reducing the amount of the cooling fluid flowing through the gaps 25. Thus, the cooling efficiency of the stacked body 20 may be lowered. In addition, if the supply direction T of the cooling fluid is larger than the above angular range (θ>45°), the flow of the cooling fluid from the upper side, may reduce the amount of the cooling fluid discharged from the wellholes 24. Thus, the cooling efficiency of the stacked body 20 may be lowered. From this viewpoint, it is preferable that the supply direction T of the cooling fluid be in the angular range described above, that is, 45° or less with respect to the XY plane.

Further, according to the electronic device 1 described above, in addition to improvement of the heat dissipation and the cooling efficiency, the signal transmission distance may be reduced.

Figure 10:
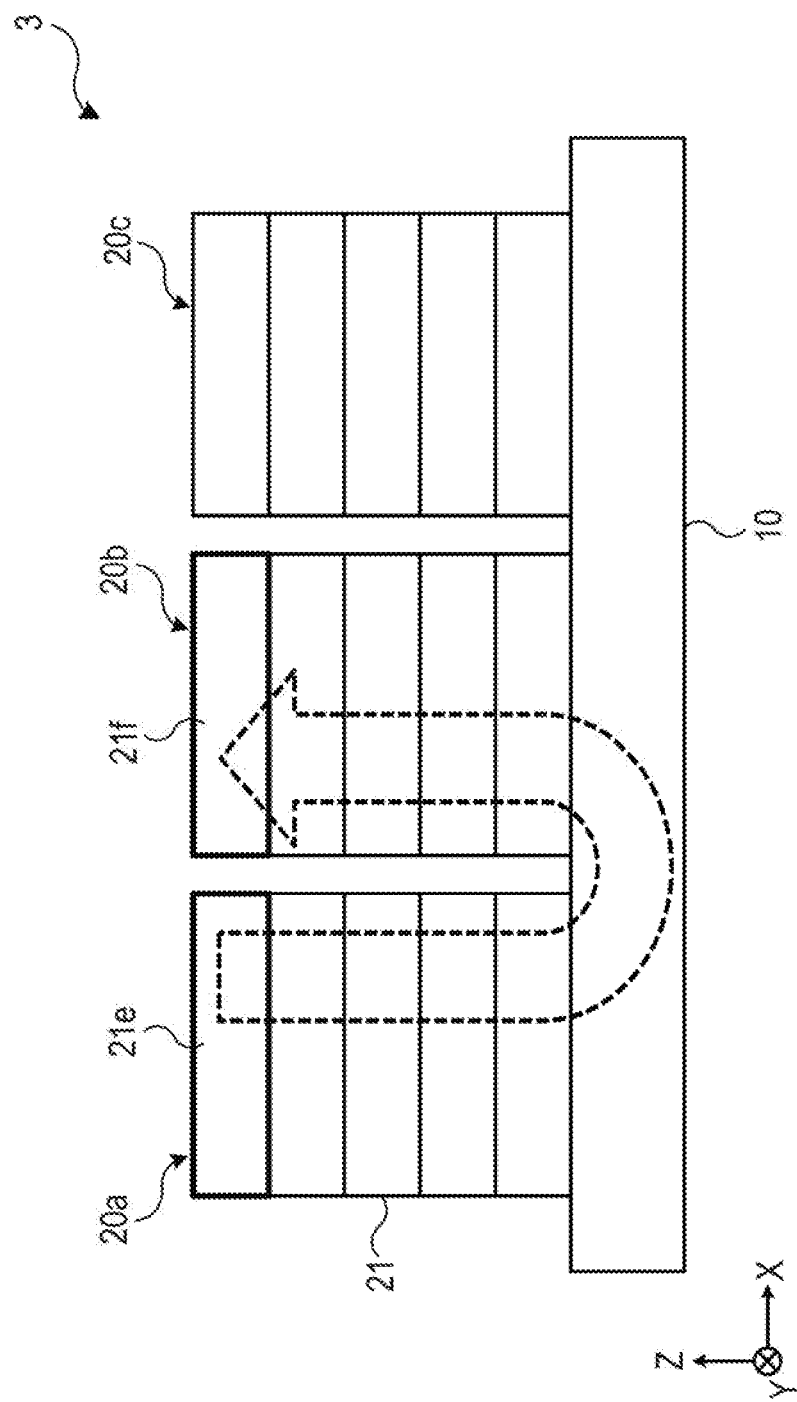
FIG. 10 is a view illustrating an example of an electronic device according to another embodiment.

FIG. 10 is a view illustrating an example of an electronic device according to another embodiment. FIG. 10 is a schematic sectional view of a main part of an example of an electronic device.

The electronic device 3 illustrated in FIG. 10 includes stacked bodies 20a, 20b, and 20c each including groups of electronic components 21 stacked in the Z direction. The stacked bodies 20a, 20b, and 20c are mounted on the circuit board 10 separated from each other. Adjacent upper and lower electronic components 21 stacked in the Z direction in each of the stacked bodies 20a, 20b, 20c are coupled to each other by using bumps made of, for example, solder, and the lowermost electronic component 21 is coupled to the circuit board 10 by using bumps made of, for example, solder.

In the electronic device 3 described above, when signals are exchanged between predetermined electronic components 21, the signal transmission distance may increase depending on the arrangement thereof.

For example, a case is assumed in which a signal is sent from an electronic component 21e at an uppermost layer of the stacked body 20a to an uppermost electronic component 21f of the adjacent stacked body 20b. In this case, as illustrated by a dotted line arrow in FIG. 10, a signal output from the electronic component 21e at the uppermost layer of the stacked body 20a is sent to the lowermost layer thereof, then to the lowermost layer of the stacked body 20b through the circuit board 10, and further to the electronic component 21f at the uppermost layer thereof. As described above, in the electronic device 3, the signal transmission distance may increase depending on the arrangement of the electronic components 21 that exchange signals.

On the other hand, the electronic device 1 has a structure in which groups of electronic components 21 of adjacent upper and lower layers of the stacked body 20 are coupled to each other. By employing this structure, in the electronic device 1, the signal transmission distance between the electronic components 21 may be reduced compared with the structure described with reference to the electronic device 3, and the signal transmission through the circuit board 10, which can occur in the electronic device 3, may be reduced.

Figure 11:
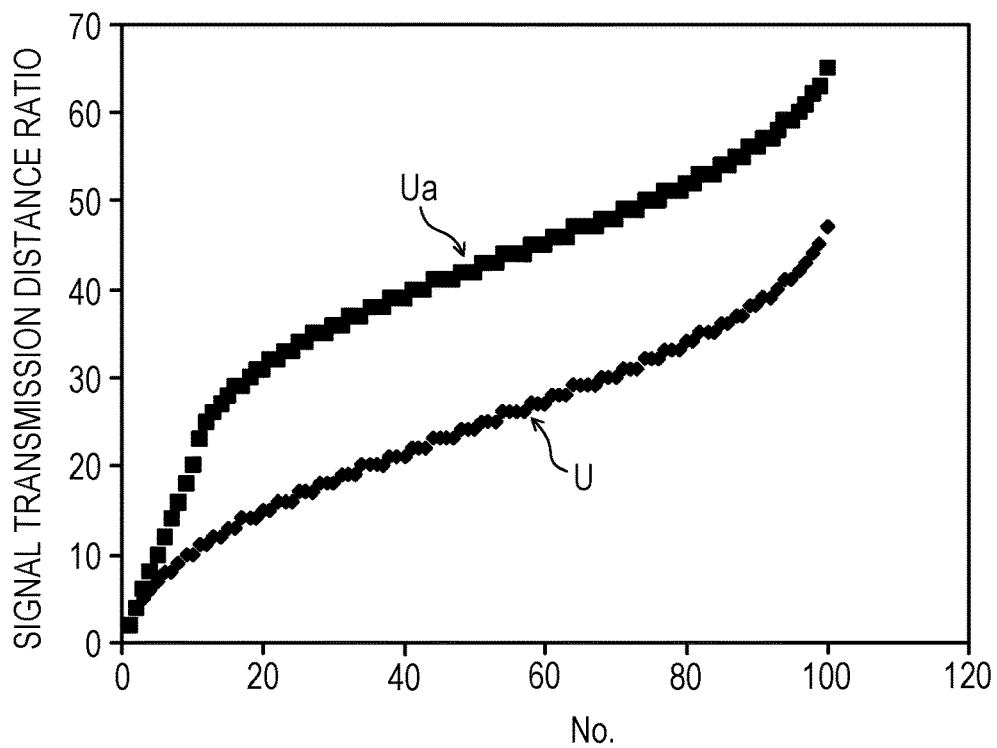
FIG. 11 is a graph illustrating an example of the signal transmission distance ratio.

FIG. 11 is a graph illustrating an example of the signal transmission distance ratio.

FIG. 11 illustrates an example of the simulation results of the signal transmission distance between electronic components 21 in the electronic device 3 and the electronic device 1 having the same total number of groups of the electronic components 21. FIG. 11 is plots of the signal transmission distance ratios (ratios of the signal transmission distances to a predetermined value) of electronic components 21 (No. 2 and higher) in ascending order of the signal transmission distance from a specific electronic component 21 (No. 1). In FIG. 11, the signal transmission distance ratios of the electronic device 3 are illustrated as plots Ua, and the signal transmission distance ratios of the electronic device 1 are illustrated as plots U.

As illustrated in FIG. 11, the signal transmission distance ratios (plots U) of the electronic device 1 do not exceed the signal transmission distance ratios (plot Ua) of the electronic device 3 in all the electronic components 21.

The stacked body 20 of the electronic device 1 has a structure in which groups of electronic components 21 of adjacent upper and lower layers are coupled to each other. The stacked body 20 of the electronic device 1 can be provided with a transmission path that allows signal transmission without passing through the circuit board 10. From FIG. 11, it can be seen that when the groups of the electronic components 21 are arranged and coupled as in the stacked body 20 of the electronic device 1, signal transmission between the electronic components 21 can be performed with a shorter distance as compared with the groups of the electronic components 21 arranged and coupled as in the stacked bodies 20a, 20b, and 20c of the electronic device 3.

As described above, in the electronic device 1 according to the first embodiment, the heat dissipation and the cooling efficiency of the stacked body 20 can be improved by the gaps 25 provided between the adjacent electronic components 21 in each layer of the stacked body 20 and the wellholes 24 communicating across the plurality of layers of the stacked body 20. As a result, overheating of the stacked body 20 and the electronic device 1 including the stacked body 20 may be effectively suppressed, and then performance degradation and damage of the stacked body 20 and the electronic device 1 due to overheating may be effectively suppressed.

Furthermore, in the electronic device 1 according to the first embodiment, the signal transmission distance between the electronic components 21 may be reduced. As a result, it is possible to effectively suppress the performance degradation of the stacked body 20 and the electronic device 1 that would be caused by increase of the signal transmission distance between the electronic components 21.

By employing the stacked body 20 having the above-described structure, it is possible to realize the electronic device 1 having high performance and high quality.

In the electronic device 1 as described above, it is preferable that the electronic components 21 in a group of each layer of the stacked body 20 be arranged in lines at a regular interval, and it is preferable that the electronic components 21 in groups in alternate layers (odd-numbered layers or even-numbered layers) are arranged so as to overlap with each other. In this arrangement, variations of the gaps 25 in each layer of the stacked body 20 can be suppressed, and wellholes 24 extending linearly in the Z direction can be formed. As a result, the cooling fluid used for cooling the stacked body 20 can efficiently flow into the stacked body 20, flow through the stacked body 20, and be discharged from the stacked body 20. Thus, the heat dissipation and cooling efficiency of the stacked body 20 can be improved, and the temperature distribution of the stacked body 20 can be made uniform.

In addition, by arranging the electronic components 21 in each group of the stacked body 20 in lines at a regular interval, variations in signal transmission distances between the predetermined electronic components 21 may be suppressed, and the stacked body 20 may have a structure that is strong against warpage and stress that may be generated when heat is applied to the stacked body 20.

In forming the electronic device 1 as described above, first, the N-th layer is formed by arranging the electronic components 21 in the group with gaps 25 therebetween, and then the (N+1)-th layer is formed by stacking the electronic components 21 in the group with gaps 25 therebetween in a layer higher than the N-th layer by one layer so as to partially overlap with the gaps 25 of the N-th layer.

For example, as described above, one of adjacent electronic components 21 in the (N+1)-th layer is stacked over one end portions of adjacent electronic components 21 in the N-th layer, and the other of the adjacent electronic components 21 in the (N+1)-th layer is stacked over the other end portions of the adjacent electronic components in the N-th layer and separated from the one of the adjacent electronic components 21 (FIGS. 5A to 5C). By performing such steps, the (N+1)-th layer is formed on the N-th layer.

The steps described above are repeatedly performed from the lowermost layer to the uppermost layer of the stacked body 20 to form the stacked body 20. The electronic device 1 is obtained by mounting the formed stacked body 20 on a circuit board 10. Alternatively, the lowermost layer of the stacked body 20 may be formed on the circuit board 10, and the above-described steps may be repeated to the uppermost layer, thereby obtaining the electronic device 1 having the stacked body 20 mounted on the circuit board 10.

For example, semiconductor element or semiconductor devices including semiconductor elements are used in the group of electronic components 21 included in the stacked body 20 of the electronic device 1 as described above. Examples of semiconductor elements and semiconductor devices used in the group of electronic components 21 will be described below with reference to FIGS. 12 to 15.

Figure 12:
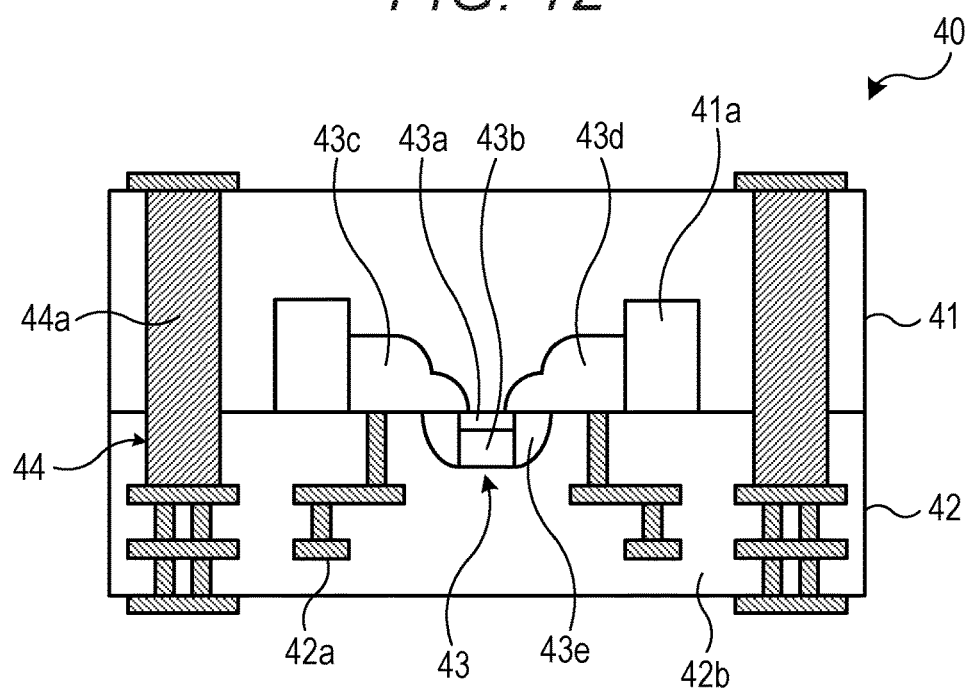
FIG. 12 is a view illustrating a configuration example of a semiconductor element.

FIG. 12 is a view illustrating a configuration example of a semiconductor element. FIG. 12 is a schematic sectional view of a main part of an example of a semiconductor element.

A semiconductor element 40 illustrated in FIG. 12 includes a semiconductor substrate 41 and a wiring layer 42 provided on the semiconductor substrate 41.

Substrates made of silicon (Si), germanium (Ge), silicon germanium (SiGe), gallium arsenide (GaAs), indium phosphorus (InP), or the like may be used as the semiconductor substrate 41. To the semiconductor substrate 41 described above, circuit elements such as transistors, capacitors, and resistors are mounted. FIG. 12 illustrates a Metal Oxide Semiconductor (MOS) transistor 43 as an example.

The MOS transistor 43 is provided in an element region defined by an element isolation region 41a provided on the semiconductor substrate 41. The MOS transistor 43 has a gate electrode 43b formed on the semiconductor substrate 41 with a gate insulating film 43a interposed therebetween, and a source region 43c and a drain region 43d are respectively formed on one side and the other side of the gate electrode 43b in the semiconductor substrate 41. A spacer 43e that is an insulating film is provided on the side wall of the gate electrode 43b.

The wiring layer 42 includes conductor portions 42a including a wiring, a via, or the like connected to the MOS transistor 43 provided on the semiconductor substrate 41 or the like, and an insulating portion 42b wrapping the conductor portions 42a. Various conductor materials such as copper (Cu) and the like are used for the conductor portions 42a. An inorganic insulating material such as silicon oxide or an organic insulating material such as a resin is used for the insulating portion 42b.

In the semiconductor element 40, conducting portions 44 that conduct between the front and back surfaces of the end portions of the semiconductor element 40 are formed. Each of the conducting portions 44 includes, for example, a Through Silicon Via (TSV) 44a formed to penetrate through the semiconductor substrate 41, and the conductor portions 42a provided in the wiring layer 42 to be coupled to the TSV 44a. Bumps made of, for example, solder, used when the semiconductor elements 40 are stacked (when the stacked body 20 described above is formed) are coupled to one end and the other end of the conducting portion 44.

FIGS. 13A to 15 are views illustrating configuration examples of a semiconductor device.

Figure 13A:
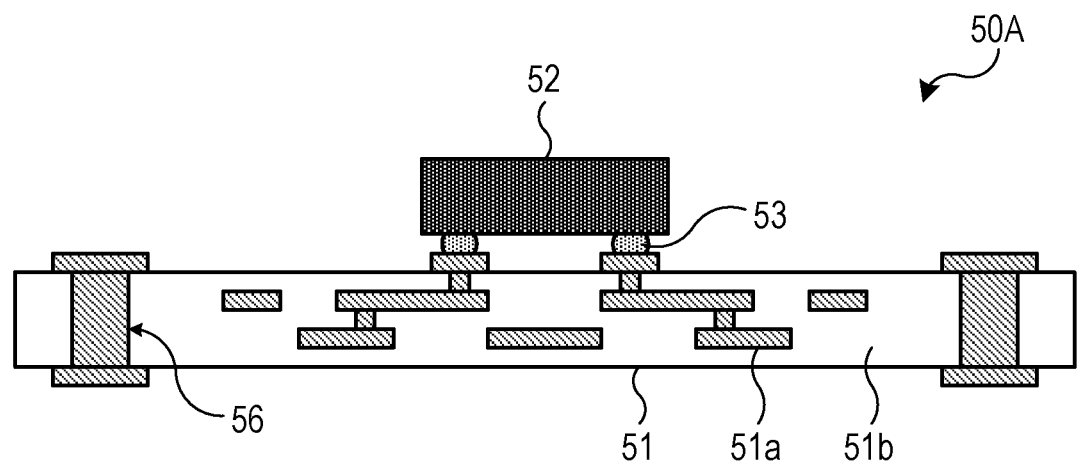
FIGS. 13A and 13B are views illustrating configuration examples of a semiconductor device (No. 1)
Figure 13B:
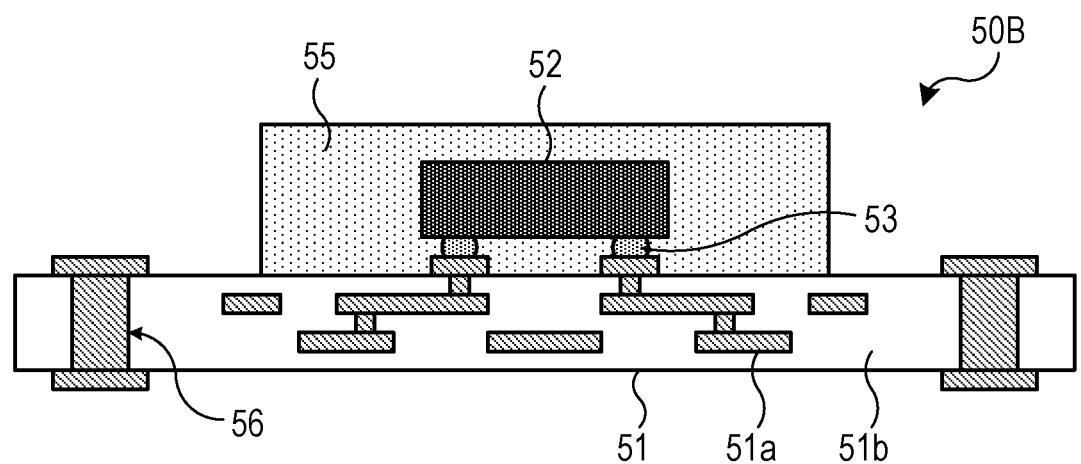

FIGS. 13A and 13B are schematic sectional views each illustrating a main portion of an example of a semiconductor device.

A semiconductor device 50A illustrated in FIG. 13A and a semiconductor device 50B illustrated in FIG. 13B each include a circuit board 51 and a semiconductor element 52 mounted on the circuit board 51.

For example, a printed circuit board is used as the circuit board 51. The circuit board 51 includes conductor portions 51a including a wiring, a via, or the like and an insulating portion 51b wrapping the conductor portions 51a. Various conductor materials such as Cu are used for the conductor portions 51a. The insulating portion 51b is made of a resin material such as a phenol resin an epoxy resin, or a polyimide resin, a composite resin material obtained by impregnating glass fibers or carbon fibers with such a resin material or the like.

The semiconductor element 52 is flip-chip bonded to the circuit board 51 using bumps 53 made of, for example, solder. An underfill resin (not illustrated) may be filled between the semiconductor element 52 and the circuit board 51. In the semiconductor device 50B illustrated in FIG. 13B, the semiconductor element 52 that is flip-chip bonded is sealed by a sealing layer 55. For the sealing layer 55, a resin material such as an epoxy resin, a resin material containing an insulating filler, or the like may be used.

In each of semiconductor device 50A and the semiconductor device 50B, conducting portions 56 that conduct between the front and back surfaces of the end portions of the circuit board 51 are formed. Each of the conducting portions 56 is formed as, for example, a via formed to penetrate through the circuit board 51. Bumps made of, for example, solder and used when the semiconductor devices 50A are stacked or the semiconductor devices 50B are stacked (when the stacked body 20 is formed) are coupled to one end and the other end of the conducting portion 56.

Figure 14A:
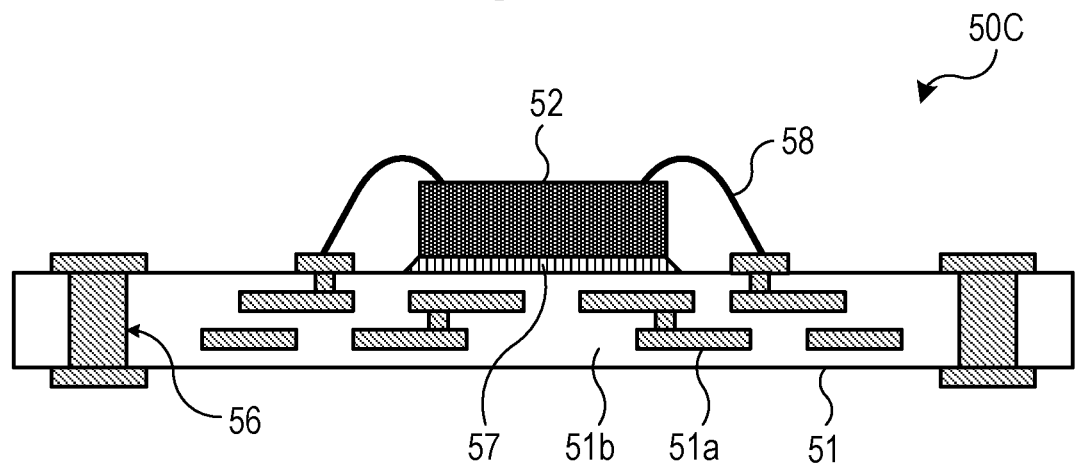
FIGS. 14A and 14B are views illustrating configuration examples of a semiconductor device (No. 2)
Figure 14B:
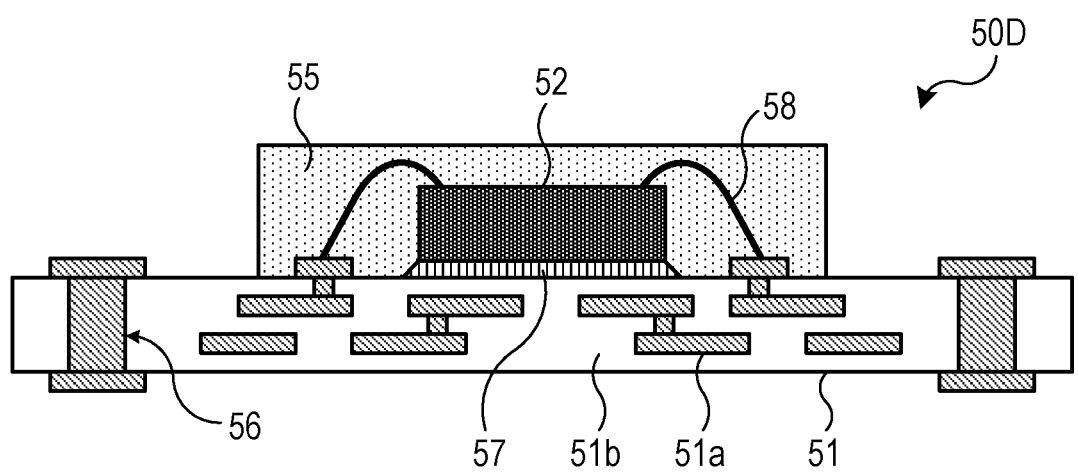

FIGS. 14A and 14B are schematic sectional views each illustrating a main portion of another example of a semiconductor device.

In each of a semiconductor device 50C illustrated in FIG. 14A and a semiconductor device 50D illustrated in FIG. 14B, the semiconductor element 52 is bonded and fixed to the circuit board 51 with a die attach material 57 such as a resin or a conductive paste, and is wire-bonded with wires 58. In the semiconductor device 50D illustrated in FIG. 14B, the semiconductor element 52 and the wires 58 that are wire-bonded are sealed by a sealing layer 55.

In each of semiconductor device 50C and the semiconductor device 50D, conducting portions 56 that conduct between the front and back surfaces of the end portions of the circuit board 51 are formed similarly to the semiconductor device 50A and the semiconductor device 50B described above. Bumps made of, for example, solder and used when the semiconductor devices 50C are stacked or the semiconductor devices 50D are stacked (when the stacked body 20 is formed described above) are coupled to one end and the other end of the conducting portion 56.

On the circuit boards 51 of each of the semiconductor devices 50A, 50B, 50C and 50D described above, a plurality of semiconductor elements 52 of the same or different types may be mounted and other components such as chip capacitors may be mounted in addition to the semiconductor elements 52.

Figure 15:
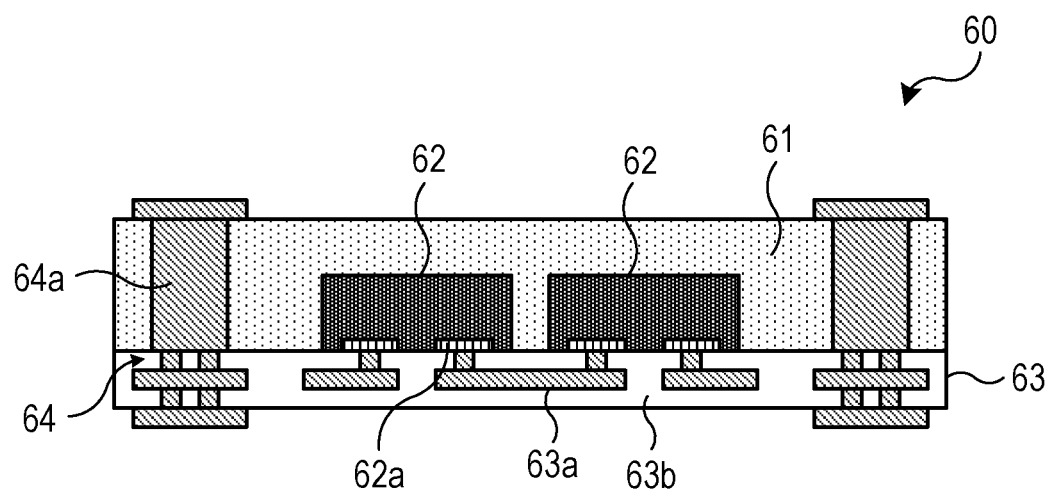
FIG. 15 is a view illustrating a configuration example of a semiconductor device (No. 3)

FIG. 15 is a schematic sectional view of a main part of another example of a semiconductor device.

A semiconductor device 60 illustrated in FIG. 15 includes a resin layer 61, a plurality of semiconductor elements 62 (two semiconductor elements are illustrated as an example) of the same or different types embedded in the resin layer 61, and a rewiring layer 63 provided, on the resin layer 61. The semiconductor elements 62 are embedded in the resin layer 61 such that the disposition surfaces of terminals 62a of the semiconductor elements 62 are exposed. The rewiring layer 63 includes conductor portions 63a including a rewiring, a via, or the like made from Cu or the like, and an insulating portion 63b that is made from a resin material, for example, and wraps the conductor portions 63a.

In the semiconductor device 60, conducting portions 64 that conduct between the front and back surfaces of the end portions of the semiconductor device 60 are formed. Each of the conducting portions 64 includes, for example, an electrode 64a formed to penetrate through the resin layer 61, and the conductor portions 63a provided in the rewiring layer 63 so as to be connected to the electrode 64a. Bumps made of, for example, solder and used when the semiconductor devices 60 are stacked (when the stacked body 20 is formed) are coupled to one end and the other end of the conducting portion 64.

In the resin layer 61 of the semiconductor device 60, one semiconductor element 62 or three or more semiconductor elements 62 of the same or different types may be embedded, and other components such as chip capacitors may be embedded in addition to the semiconductor elements 62.

As the electronic components 21 in groups of the stacked body 20 of the electronic device 1, the semiconductor element 40 illustrated in FIG. 12, the semiconductor devices 50A, 50B, 50C, and 50D illustrated in FIGS. 13A to 14B, the semiconductor device 60 illustrated in FIG. 15, and the like may be used.

Next, a second embodiment will be described.

Here, an example of an electronic device including the semiconductor element 40 as illustrated in FIG. 12 will be described as the second embodiment.

Figure 16A:
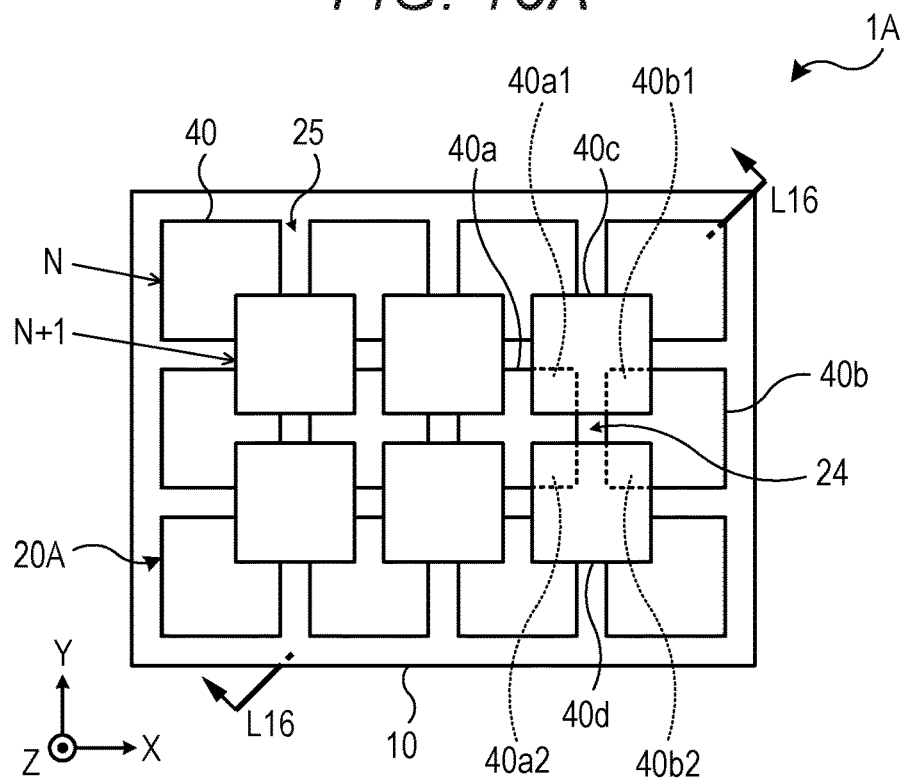
FIGS. 16A and 16B are views illustrating an example of an electronic device according to a second embodiment.
Figure 16B:
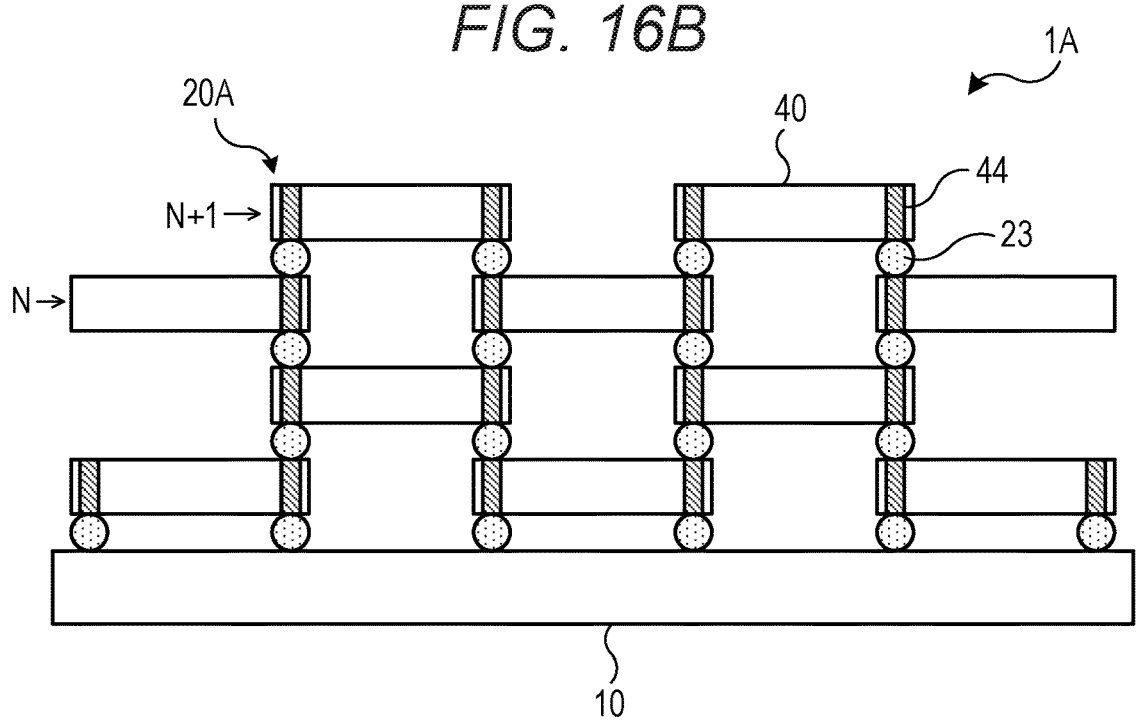

FIGS. 16A and 16B are views illustrating an example of an electronic device according to the second embodiment. FIG. 16A is a schematic plan view of a main part of the example of an electronic device. FIG. 16B is a schematic sectional view taken along line L16-L16 of FIG. 16A.

The electronic device 1A illustrated in FIGS. 16A and 16B includes a circuit board 10 and a stacked body 20A mounted on the circuit board 10. The stacked body 20A includes groups of the semiconductor elements 40 stacked in the Z direction. The semiconductor elements 40 in adjacent upper and lower layers and the group of the semiconductor elements 40 in the lowermost layer and the circuit board 10 are connected using the conducting portions 44 formed at the end portions of the semiconductor elements 40 and the circuit board 10, and the interposed bumps 23.

In the stacked body 20A, the semiconductor elements 40 in the group of each of the N-th layer (here, a layer lower than the uppermost layer by one layer) and the (N+1)-th layer (here, the uppermost layer) are arranged such that the gaps 25 between adjacent semiconductor elements 40 in the N-th layer and the gaps 25 between adjacent semiconductor elements 40 in the (N+1)-th layer partially overlap with each other.

For example, out of the semiconductor elements 40 in the groups of the stacked body 20A, some semiconductor elements 40a, 40b, 40c, and 40d are focused. As illustrated in FIG. 16A, in the stacked body 20A, the semiconductor element 40c in the (N+1)-th layer is stacked over opposing one end portions 40a1 and 40b1 of the semiconductor elements 40a and 40b arranged side by side and separated from each other in the N-th layer. Further, in the stacked body 20A, the semiconductor element 40d in the (N+1)-th layer is stacked over the other end portions 40a2 and 40b2, which oppose to each other, of the semiconductor elements 40a and 40b in the N-th layer, and is arranged separated from the semiconductor element 40c.

The stacked body 20A includes structural portions repeatedly arranged similarly to the semiconductor elements 40a, 40b, and 40c, and structural portions repeatedly arranged similarly to the semiconductor elements 40a, 40b, 40c, and 40d.

In the stacked body 20A, a part of the gap 25 between adjacent but separated semiconductor elements 40 in the lower layer and a part of the gap 25 between adjacent but separated semiconductor elements 40 in the upper layer overlap with each other, whereby a wellhole 24 is formed.

In the electronic device 1A, the gaps 25 provided between adjacent semiconductor elements 40 in each layer of the stacked body 20A realize a flow path through which cooling fluid can flow in the X direction or the Y direction. In addition, the wellholes 24 formed to communicate across a plurality of layers realize a flow path through which cooling fluid can flow in the Z direction. By the cooling fluid flowing from the outside into the gaps 25, flowing through the gaps 25, and discharged due to the chimney effect of the wellholes 24, the heat dissipation and the cooling efficiency of the stacked body 20A are improved.

Further, in the electronic device 1A, groups of semiconductor elements 40 in adjacent upper and lower layers of the stacked body 20A are coupled to each other. Thus, the signal transmission distance between the semiconductor elements 40 may be reduced.

Overheating of the stacked body 20A, overheating of the electronic device 1A including the stacked body 20A, performance degradation and damage due to overheating, and performance degradation due to increased signal transmission distance may be effectively suppressed. Thus, it is possible to realize the electronic device 1A having high performance and high quality.

In addition, it is possible to realize an electronic apparatus that includes the electronic device 1A described above, and that has high performance and high quality. Alternatively, it is possible to realize an electronic apparatus that includes the electronic device 1A and a cooling device supplying cooling fluid in a predetermined direction to the stacked body 20A of the electronic device 1A and that has high performance and high quality.

Although the example in which the semiconductor element 40 illustrated in FIG. 12 is used as the electronic component has been described, it is also possible to obtain an electronic device by using the semiconductor device 60 illustrated in FIG. 15 and forming a stacked body similar to the stacked body 20A using the conducting portion 64 of the semiconductor device 60.

Next, a third embodiment will be described.

Here, an example of an electronic device including the semiconductor device 50A as illustrated in FIG. 13A will be described as the third embodiment.

Figure 17A:
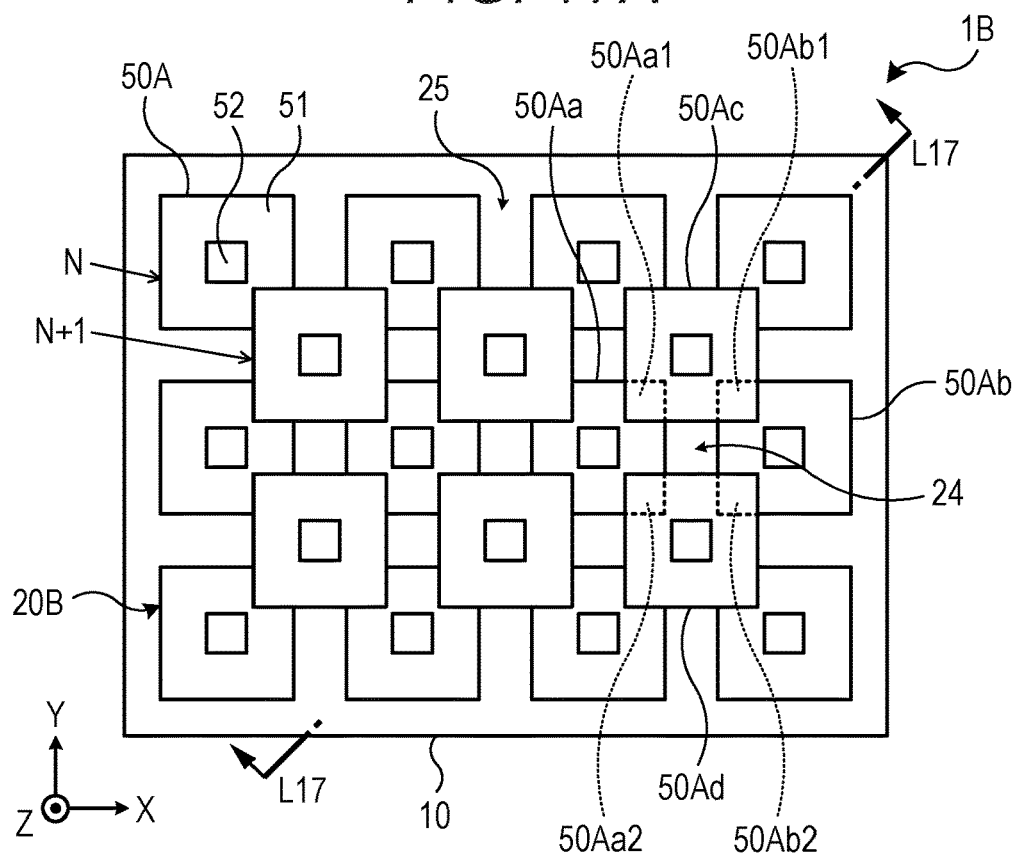
FIGS. 17A and 17B are views illustrating an example of an electronic device according to a third embodiment.
Figure 17B:
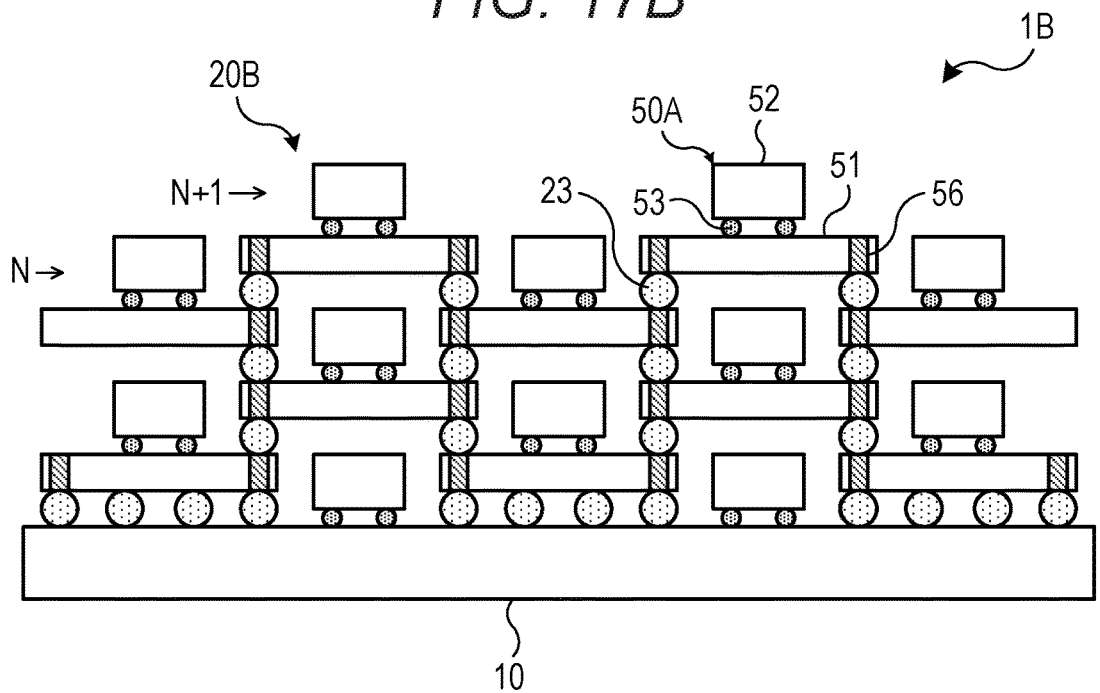

FIGS. 17A and 17B are views illustrating an example of an electronic device according to the third embodiment FIG. 17A is a schematic plan view of a main part of the example of an electronic device. FIG. 17B is a schematic sectional view taken along line L17-L17 of FIG. 17A.

An electronic device 1B illustrated in FIGS. 17A and 17B includes a circuit board 10 and a stacked body 20B mounted on the circuit board 10. The stacked body 20B includes groups of the semiconductor devices 50A stacked in the Z direction. The semiconductor devices 50A in adjacent upper and lower layers and the group of the semiconductor devices 50A in the lowermost group and the circuit board 10 are coupled using conducting portions 56 formed at the end portions of the semiconductor devices 50A and the circuit board 10, and interposed bumps 23. A semiconductor element 52 may be directly coupled to the circuit board 10 using the bumps 53.

In the stacked body 20B, the semiconductor devices 50A in the group of each of the N-th layer (here, a layer lower than the uppermost layer by one layer) and the (N+1)-th layer (here, the uppermost layer) are arranged such that the gaps 25 between adjacent semiconductor devices 50A in the N-th layer and the gaps 25 between adjacent semiconductor devices 50A in the (N+1)-th layer partially overlap with each other.

For example, out of the semiconductor devices 50A in the groups of the stacked body 20B, some semiconductor elements 50Aa, 50Ab, 50Ac, and 50Ad are focused. As illustrated in FIG. 17A, in the stacked body 20B, the semiconductor device 50Ac in the (N+1)-th layer is stacked over opposing one end portions 50Aa1 and 50Ab1 of the semiconductor devices 50Aa and 50Ab that are arranged side by side and separated from each other in the N-th layer. Further, in the stacked body 20B, the semiconductor device 50Ad in the (N+1)-th layer is stacked over the other end portions 50Aa2 and 50Ab2, which oppose to each other, of the semiconductor devices 50Aa and 50Ab in the N-th layer, and is arranged separated from the semiconductor device 50Ac. The stacked body 20B includes structural portions repeatedly arranged similarly to the semiconductor devices 50Aa, 50Ab, and 50Ac, and structural portions repeatedly arranged similarly to the semiconductor devices 50Aa, 50Ab, 50Ac, and 50Ad.

In the stacked body 20B, a part of the gap 25 between adjacent semiconductor devices 50A which are separated with each other in the lower layer and a part of the gap 25 between adjacent semiconductor devices 50A which are separated with each other in the upper layer overlap with each other, whereby a wellhole 24 is formed.

In the electronic device 1B, cooling fluid can flow in the X direction or the Y direction between adjacent semiconductor devices 50A in each layer of the stacked body 20B, and can flow in the Z direction through the wellholes 24 communicating across a plurality of layers. By the cooling fluid flowing from the outside into the stacked body 20B, flowing inside the stacked body 20B, and discharged due to the chimney effect of the wellholes 24, the heat dissipation and the cooling efficiency of the stacked body 20B are improved.

In the electronic device 1B, it is preferable to reduce the sues of the bumps 53 for coupling the semiconductor elements 52 of the semiconductor device 50A and the circuit board 51, and the bumps 53 for coupling the semiconductor elements 52 and the circuit board 10. For example, the sizes of the bumps 53 are made smaller than the size of the bumps 23 coupling the semiconductor devices 50A and the size of the bumps 23 coupling the semiconductor devices 50A and the circuit board 10. This expands the flow path of the cooling fluid flowing through the stacked body 20B, further improving the heat dissipation and the cooling efficiency of the stacked body 20B.

Further, in the electronic device 1B, groups of semiconductor devices 50A in adjacent upper and lower layers of the stacked body 20B are coupled to each other. Thus, the signal transmission distance between the semiconductor devices 50A may be reduced.

Overheating of the stacked body 20B and overheating of the electronic device 1B including the stacked body 20B may be effectively suppressed, and then performance degradation and damage thereof due to overheating and performance degradation due to increased signal transmission distance may be effectively suppressed. Thus, it is possible to realize the electronic device 1B having high performance and high quality.

In addition, it is possible to realize an electronic apparatus that includes the electronic device 1B described above, and that has high performance and high quality. Alternatively, it is possible to realize an electronic apparatus that includes the electronic device 1B and a cooling device supplying cooling fluid in a predetermined direction to the stacked body 20B of the electronic device 1B and that has high performance and high quality.

Here, an example in which the semiconductor device 50A as illustrated in FIG. 13A is used as an electronic component has been described. Alternatively, an electronic device may be obtained by using the semiconductor devices 50B, 50C, and 50D illustrated in FIGS. 13B, 14A, and 14B, and forming a stacked body similar to the stacked body 20B described above using the conducting portions 56 of the semiconductor devices 50B, 50C, and 50D.

When the semiconductor device 50C illustrated in FIG. 14A is used, it is preferable to reduce the thickness of the die attach material 57. When the semiconductor device 50B illustrated in FIG. 13B or the semiconductor device 50D illustrated in FIG. 14B is used, it is preferable to reduce the height of the sealing layer 55. This expands the flow path of the cooling fluid in the stacked body, further improving the heat dissipation and the cooling efficiency.

Figure 18A:
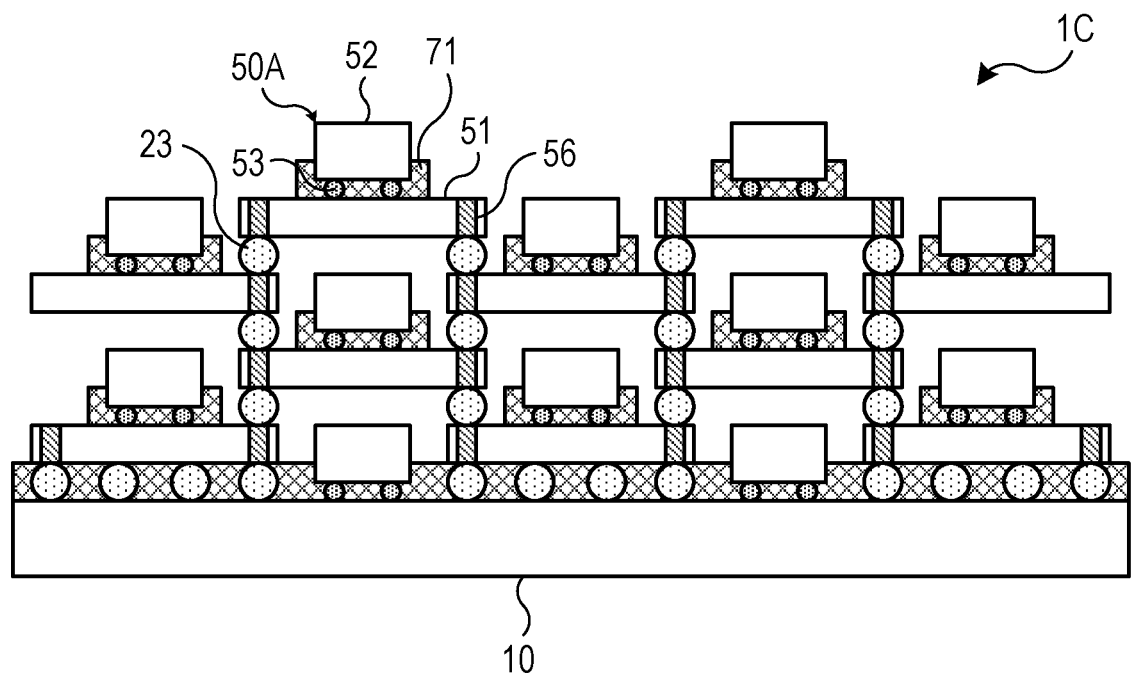
FIGS. 18A and 18B are views illustrating a modification of the electronic device according to the third embodiment.
Figure 18B:
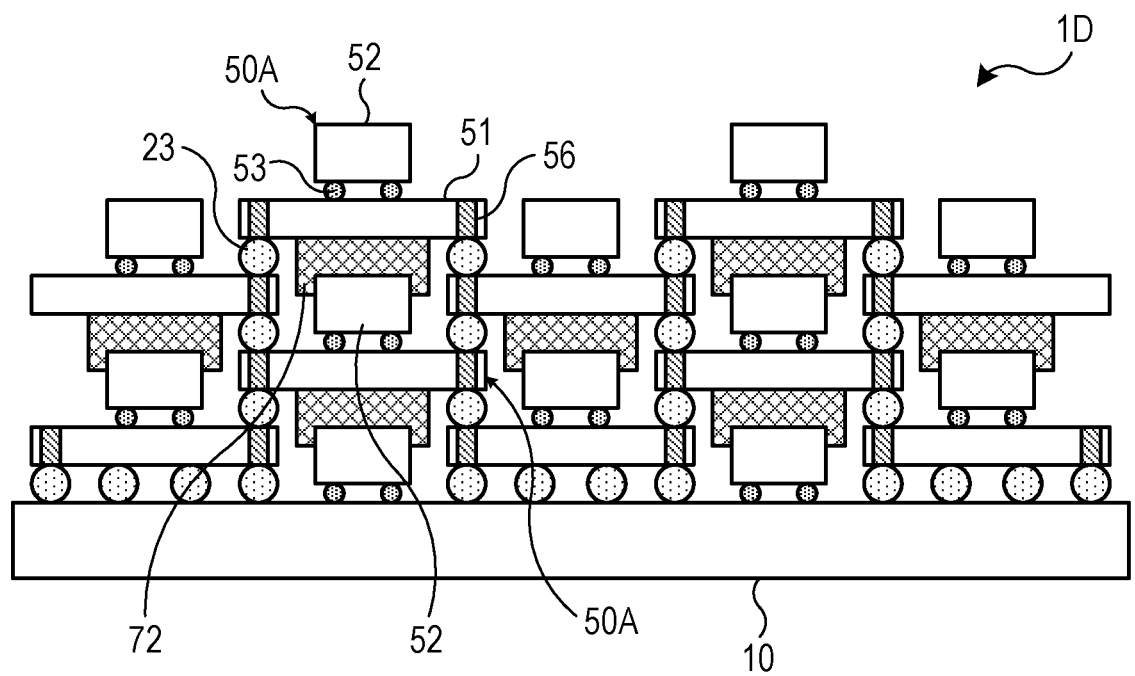

FIGS. 18A and 18B are views illustrating a modification of the electronic device according to the third embodiment.

FIG. 18A is a schematic sectional view of a main part of a first modification. FIG. 18B is a schematic sectional view of a main part of a second modification.

An electronic device 1C illustrated in FIG. 18A is different from the electronic device 1B described above in that the connection portions using the bumps 53 and the bumps 23 are sealed with an adhesive 71 made of an underfill resin, for example. The connection portion between the semiconductor elements 52 and the circuit board 51 in each of the semiconductor devices 50A in groups, the connection portion between the semiconductor devices 50A in groups and the circuit board 10, and the connection portion between the semiconductor elements 52 and the circuit board 10 are reinforced with the adhesive 71. Thus, the connection reliability in the electronic device 1C is improved. When an adhesive having a high thermal conductivity is used as the adhesive 71, the cooling efficiency is improved by the cooling sheet effect.

An electronic device 1D illustrated in FIG. 18B is different from the electronic device 1B described above in that the circuit board 51 of the semiconductor device 50A on the upper layer side and the semiconductor element 52 of the semiconductor device 50A on the lower layer side located immediately below the circuit board 51 are bonded with an adhesive 72. The connection between the semiconductor devices 50A positioned directly above and directly below each other is reinforced with the adhesive 72. Thus, the connection reliability in the electronic device 1D is improved. When an adhesive having a high thermal conductivity is used as the adhesive 72, the cooling efficiency is improved by the cooling sheet effect.

The reinforcement of the predetermined portions using the adhesive 71 or the adhesive 72 may realize the electronic device or the electronic device 1D having high performance, high quality, and high reliability.

In addition, it is possible to realize; an electronic apparatus that includes the electronic device 1C or the electronic device 1D described above, and that has high performance, high quality, and high reliability. Alternatively, it is possible to realize an electronic apparatus that includes the electronic device 1C or the electronic device 1D and a cooling device supplying cooling fluid and that has high performance, high quality, and high reliability.

Although the example in which the semiconductor device 50A is used has been described as the electronic component, the semiconductor devices 50B, 50C, and 50D described above may be used to obtain a similar electronic device.

The types of the semiconductor element 52 in groups and the types of the circuit boards 51 in groups included in the electronic devices 1B, 1C, 1D, and the like according to the third embodiment are not limited. For example, all of the semiconductor elements 52 in the groups may be of the same type or some of the semiconductor elements 52 may be of different types. Similarly, all of the circuit boards 51 in the groups may be of the same type or some of the circuit boards 51 may be of different types.

Next, a fourth embodiment will be described.

Figure 19A:
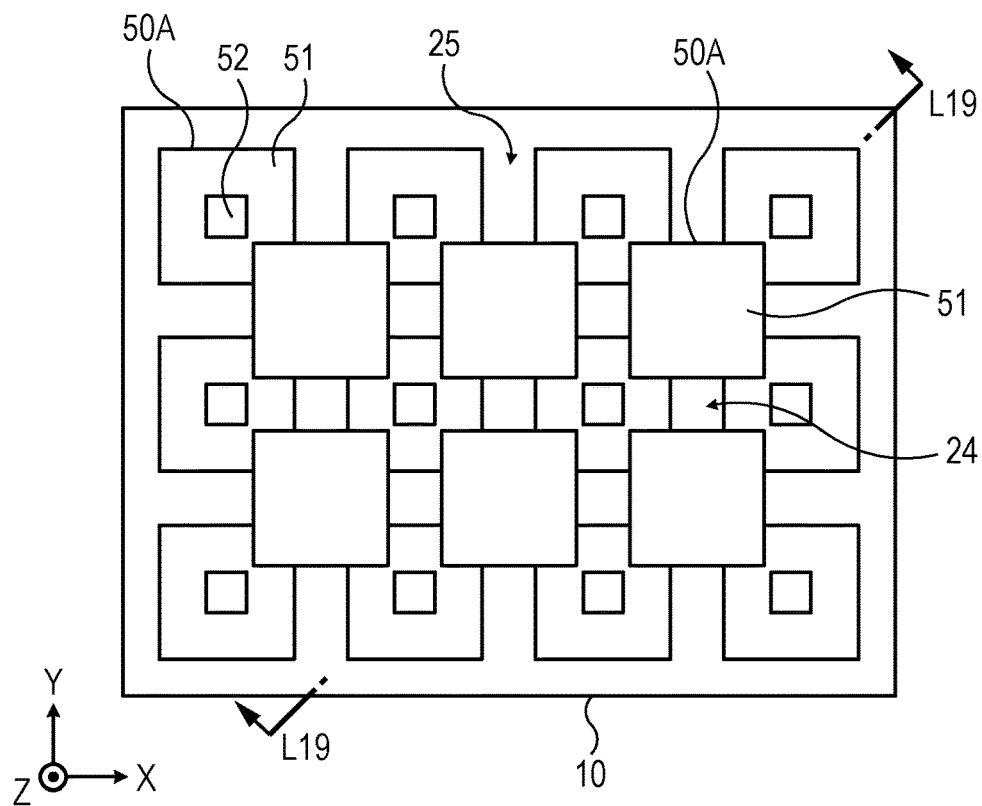
FIGS. 19A and 19B are views illustrating an example of an electronic device according to a fourth embodiment.
Figure 19B:
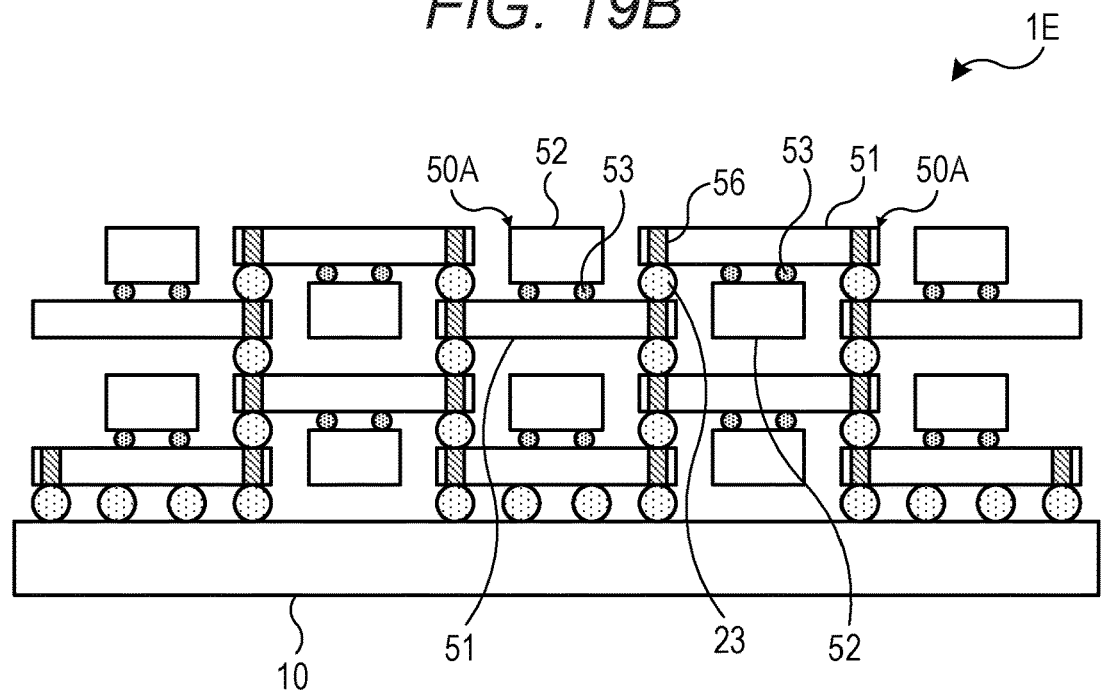

FIGS. 19A and 19B are views illustrating an example of an electronic device according to the fourth embodiment. FIG. 19A is a schematic plan view of a main part of the example of an electronic device. FIG. 19B is a schematic sectional view taken along line L19-L19 of FIG. 19A.

The electronic device 1E illustrated in FIGS. 19A and 19B is different from the electronic device 1B described above in that the semiconductor devices 50A are stacked and connected in a manner that the mounting surfaces, on which the semiconductor elements 52 are mounted, of the circuit boards 51 in adjacent upper and lower layers face in opposite directions.

When the semiconductor devices 50A each having the circuit board 51 and the semiconductor element 52 mounted thereon are coupled to each other, and when the semiconductor devices 50A and the circuit board 10 are coupled to each other using the bumps 23, warpage may be generated on the circuit boards 51 in a certain direction due to heat applied at the time of connection. For example, warpage may be generated on the circuit boards 51 of the semiconductor device 50A so that the mounting surface sides of the semiconductor elements 52 become convex.

In the electronic device 1E, the semiconductor devices 50A are stacked in a manner that the mounting surfaces, on which the semiconductor elements 52 are mounted, of the circuit boards 51 in adjacent upper and lower layers face in opposite directions. Thus, in a connection process along with heating, the semiconductor devices 50A in the adjacent upper and lower layers warp in opposite directions. As a result, the stress generated at the bumps 23 and the bumps 53 of the connection portion due to the warpage of the circuit boards 51 is reduced, and the connection failure caused by the stress is suppressed. Thus, the connection reliability in the electronic device 1E may be improved.

In this way, by stacking the semiconductor devices 50A facing in opposite directions, the electronic device 1E having high performance, high quality and high reliability may be realized.

In addition, it is possible to realize an electronic apparatus that includes the electronic device 1E described above, and that has high performance, high quality, and high reliability. Alternatively, it is possible to realize an electronic apparatus that includes the electronic device 1E and a cooling device supplying cooling fluid and that has high performance, high quality, and high reliability.

Although the example in which the semiconductor device 50A is used as the electronic component has been described, the semiconductor devices 50B, 50C, and 50D described above may be used to obtain a similar electronic device.

The types of the semiconductor element 52 in groups and the types of the circuit boards 51 in groups included in the electronic device 1E, and the like according to the fourth embodiment are not limited. For example, all of the semiconductor elements 52 in the groups may be of the same type or some of the semiconductor elements 52 may be of different types. Similarly, all of the circuit boards 51 in the groups may be of the same type or some of the circuit boards 51 may be of different types.

Next, a fifth embodiment will be described.

The electronic devices 1, 1A, 1B, 1C, 1D, 1E and the like can be mounted on various electronic devices. For example, the electronic devices can be used in various electronic devices such as computers (personal computers, supercomputers, servers, etc.), smart phones, mobile phones, tablet terminals, sensors, cameras, audio, devices, measuring devices, inspection devices, manufacturing devices, and the like.

Figure 20:
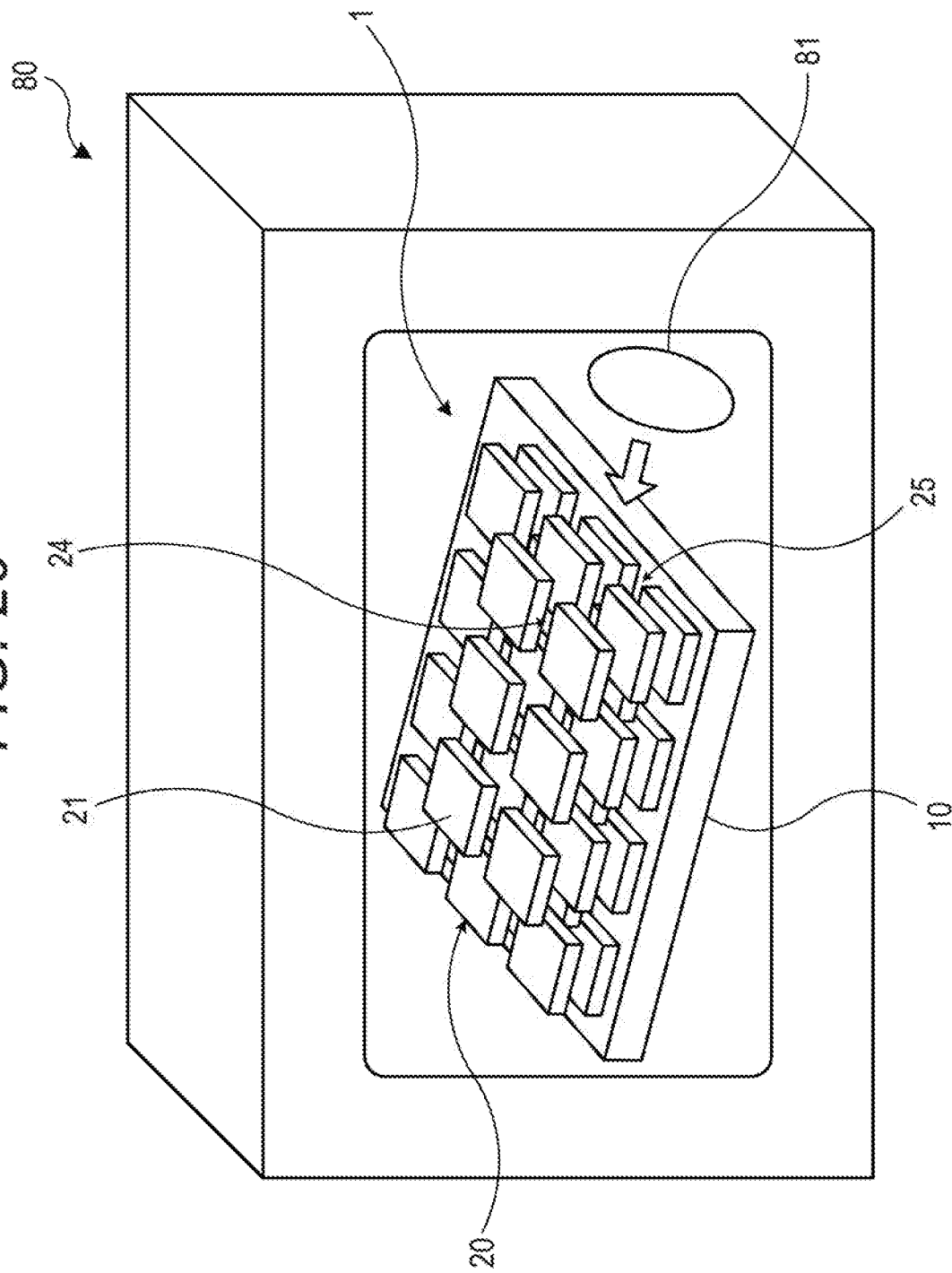
FIG. 20 is an explanatory view of an electronic apparatus according to a fifth embodiment.

FIG. 20 is an explanatory view of an electronic apparatus according to the fifth embodiment. FIG. 20 schematically illustrates an example of an electronic apparatus.

As illustrated in FIG. 20, for example, the electronic device 1 illustrated in FIG. 4 or the like is mounted on (embedded in) various electronic apparatuses 80. From the viewpoint described above with reference to FIG. 9, a cooling device 81 for supplying cooling fluid to the stacked body 20 of the electronic device 1 from a predetermined direction may be mounted on each of the electronic devices 80. For example, the cooling device 81 includes a fan or the like for blowing cooling fluid of gas, or a pump for delivering cooling fluid of liquid and the like.

As described above, in the electronic device 1, heat dissipation of the stacked body 20 is performed efficiently by the cooling fluid flowing from the outside into the gaps 25, flowing through the gaps 25, and discharged due to the chimney effect of the wellholes 24. In addition, by employing the structure, in which groups of electronic components 21 of adjacent upper and lower layers are coupled to each other, signals can be transmitted between the electronic components 21 over a short distance. It is possible to realize the electronic device 1, in which overheating, performance degradation and damage due to overheating and performance degradation due to increased signal transmission distance may be effectively suppressed and having high performance and high quality. In addition, it is possible to realize the electronic device 80 having the electronic device 1 mounted thereon and having high performance and high quality.

Although the electronic device 1 illustrated in FIG. 4 and the like is used as an example, other electronic devices 1A, 1B, 1C, 1D, 1E or the like may be similarly mounted on various electronic devices.

The above description merely provides examples. Moreover, many modifications and variations can be made by those skilled in the art, and the invention is not limited to the precise arrangements and applications illustrated and described above. All corresponding variations and equivalents are considered to be within the scope of the invention according to the appended claims and equivalents thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic device comprising:
    a first layer that includes first electronic components in a group and has a first through space between adjacent ones of the first electronic components; and
    a second layer that is stacked over the first layer and includes second electronic components which are coupled to the first electronic components and a second through space between adjacent ones of the second electronic components, the second through space being partially overlapping with the first through space,
    wherein each of four ends of a specific second electronic component included in the second electronic components is stacked on a different first electronic component included in the first electronic components,
    each of the first electronic components includes a first conduction via penetrating the each of the first electronic components in the stacking direction, and
    each of the second electronic components includes a second conduction via penetrating the each of the second electronic components in the stacking direction, and the second conduction via is electrically connected to the first conduction via.

2. The electronic device according to claim 1, wherein a semiconductor element is used as each of the first electronic components and each of the second electronic components.

3. A method of manufacturing an electronic device, comprising:
    forming a first layer that includes first electronic components in a group and has a first through space between adjacent ones of the first electronic components; and
    forming, over the first layer, a second layer that includes second electronic components in a group which are coupled to the first electronic components, and has a second through space between adjacent ones of the second electronic components, the second through space being partially overlapping with the first through space,
    wherein each of four ends of a specific second electronic component included in the second electronic components is stacked on a different first electronic component included in the first electronic components,
    each of the first electronic components includes a first conduction via penetrating the each of the first electronic components in the stacking direction, and
    each of the second electronic components includes a second conduction via penetrating the each of the second electronic components in the stacking direction, and the second conduction via is electrically connected to the first conduction via.

4. An electronic apparatus including an electronic device comprising:
    a first layer that includes first electronic components in a group and has a first through space between adjacent ones of the first electronic components; and
    a second layer that is stacked over the first layer and includes second electronic components which are coupled to the first electronic components and a second through space between adjacent ones of the second electronic components, the second through space being partially overlapping with the first through space,
    wherein each of four ends of a specific second electronic component included in the second electronic components is stacked on a different first electronic component included in the first electronic components,
    each of the first electronic components includes a first conduction via penetrating the each of the first electronic components in the stacking direction, and
    each of the second electronic components includes a second conduction via penetrating the each of the second electronic components in the stacking direction, and the second conduction via is electrically connected to the first conduction via.

5. The electronic apparatus according to claim 4, further comprising a cooling device configured to supply cooling fluid to the first layer and the second layer from a direction intersecting a stacking direction of the first layer and the second layer.

6. The electronic apparatus according to claim 4, wherein a semiconductor element is used as each of the first electronic components and each of the second electronic components.

* * * * *